United States Patent

Schultz

(10) Patent No.: US 6,704,095 B2
(45) Date of Patent: Mar. 9, 2004

(54) CONTROL OF A DISTRIBUTION OF ILLUMINATION IN AN EXIT PUPIL OF AN EUV ILLUMINATION SYSTEM

(75) Inventor: Jörg Schultz, Aalen (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 10/060,282

(22) Filed: Jan. 30, 2002

(65) Prior Publication Data

US 2003/0002022 A1 Jan. 2, 2003

Related U.S. Application Data

(63) Continuation of application No. PCT/EP00/07160, filed on Jul. 26, 2000.

(30) Foreign Application Priority Data

Jul. 30, 1999 (DE) .......................... 199 35 568
Sep. 9, 1999 (DE) ..................... 299 15 847 U

(51) Int. Cl.[7] .................. G03B 27/54; G03B 27/42; G03B 27/72
(52) U.S. Cl. .............. 355/67; 355/53; 355/71
(58) Field of Search .............. 355/53, 67, 71; 362/268, 317, 341

(56) References Cited

U.S. PATENT DOCUMENTS

| | | | |
|---|---|---|---|
| 5,222,112 A | 6/1993 | Terasawa et al. | 378/34 |
| 5,305,054 A | 4/1994 | Suzuki et al. | 355/53 |
| 5,339,346 A | 8/1994 | White | 378/34 |
| 5,363,170 A | 11/1994 | Muraki | 355/67 |
| 5,379,090 A | 1/1995 | Shiraishi | 355/67 |
| 5,526,093 A | 6/1996 | Takahashi | 355/53 |
| 5,581,605 A | 12/1996 | Murakami et al. | 378/84 |
| 5,669,708 A | 9/1997 | Mashima et al. | 362/341 |
| 5,677,939 A | 10/1997 | Oshino | 378/34 |
| 5,757,882 A | 5/1998 | Gutman | 378/84 |
| 5,825,844 A | 10/1998 | Miyake et al. | 378/34 |
| 5,896,438 A | 4/1999 | Miyake et al. | 378/34 |
| 5,920,380 A | 7/1999 | Sweatt | 355/77 |
| 5,993,010 A | 11/1999 | Ohzawa et al. | 353/99 |
| 6,038,279 A | 3/2000 | Miyake et al. | 378/34 |
| 6,452,661 B1 * | 9/2002 | Komatsuda | 355/67 |

FOREIGN PATENT DOCUMENTS

| | | |
|---|---|---|
| DE | 19716794 A1 | 10/1997 |
| EP | 0939341 A2 | 9/1999 |
| EP | 0626621 B1 | 11/1999 |
| EP | 1026547 A2 | 8/2000 |
| JP | 05100097 | 4/1993 |
| JP | 09063943 A | 3/1997 |
| JP | 10062710 A | 3/1998 |
| JP | 10092727 A | 4/1998 |
| JP | 10275771 A | 10/1998 |
| JP | 10303123 A | 11/1998 |

OTHER PUBLICATIONS

European Search Report for European Application No. 02008198.0.1242 dated Jul. 29, 2002.

* cited by examiner

*Primary Examiner*—Rodney Fuller
(74) *Attorney, Agent, or Firm*—Ohlandt, Greeley, Ruggiero & Perle, LLP

(57) ABSTRACT

There is provided an illumination system for a projection exposure system. The illumination system includes (a) a light source for the emission of wavelengths of $\leq 193$ nm, (b) a device for producing secondary light sources, the device including a mirror having raster elements, (c) a diaphragm plane, (d) a first optical element for imaging the diaphragm plane in an exit pupil of the illumination system, (e) an object plane in which images of the raster elements are substantially in line and illuminate a predetermined field with an intensity distribution, and (f) a second optical element for producing a light distribution in the exit pupil. The light distribution is specified by a parameter selected from the group consisting of type and filling degree, and the parameter is modified by a technique selected from the group consisting of exchanging, displacing and deforming the second optical element.

86 Claims, 32 Drawing Sheets

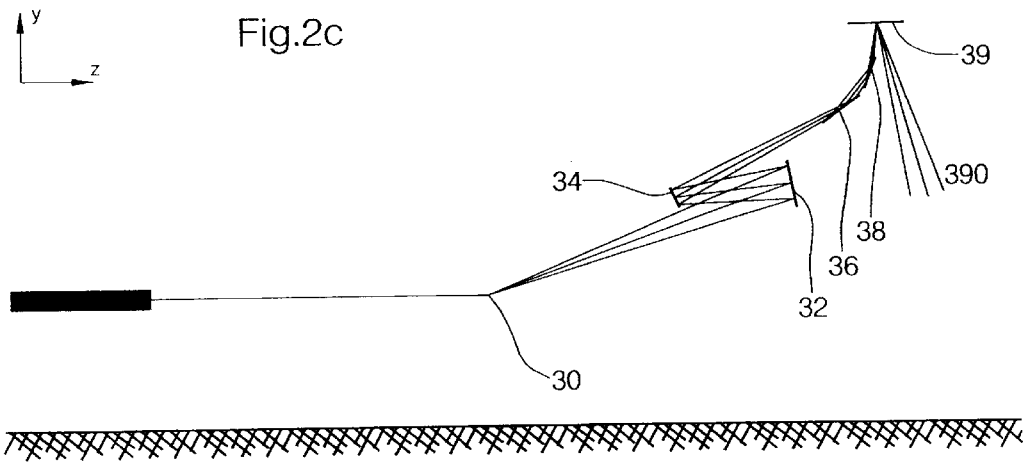
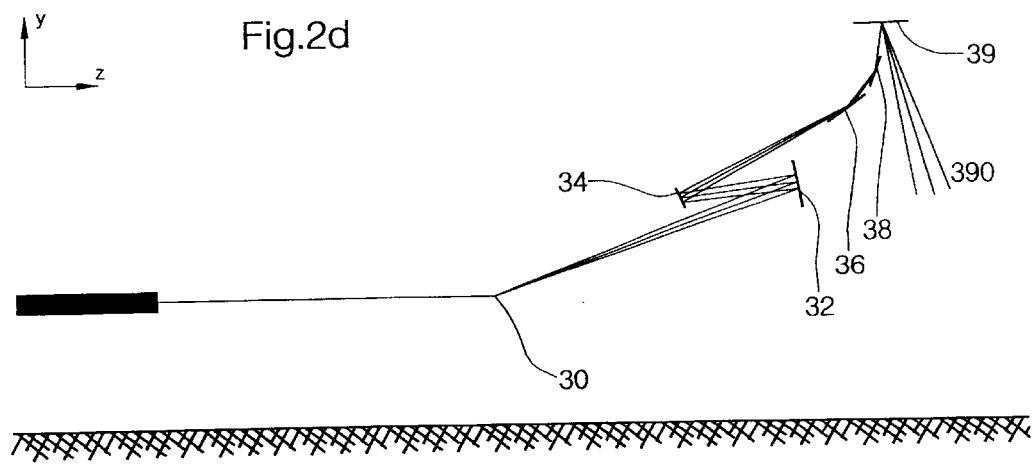

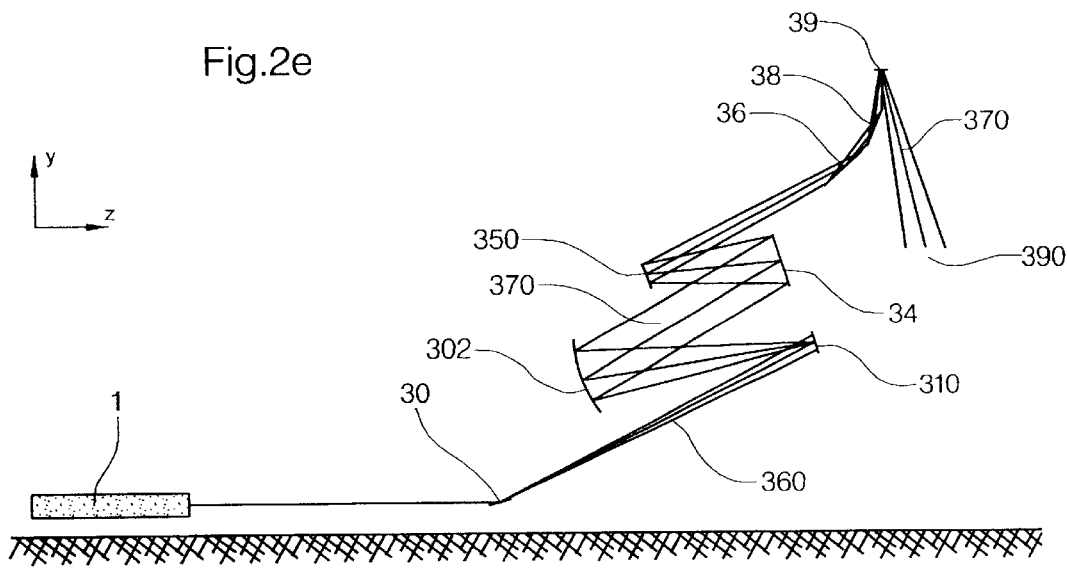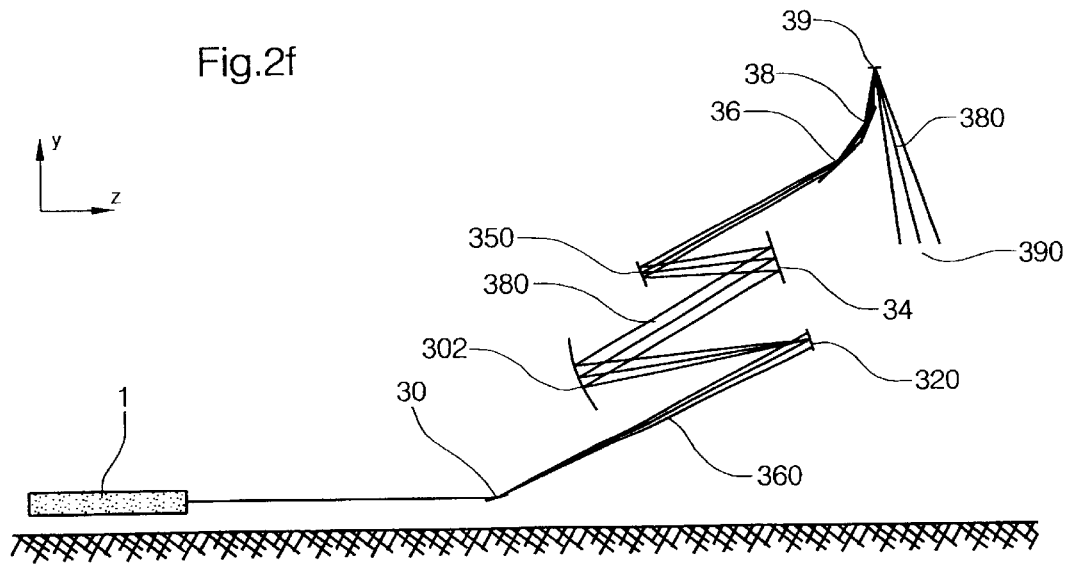

$r_{lighting}$ $R_{objective\ aperture}$

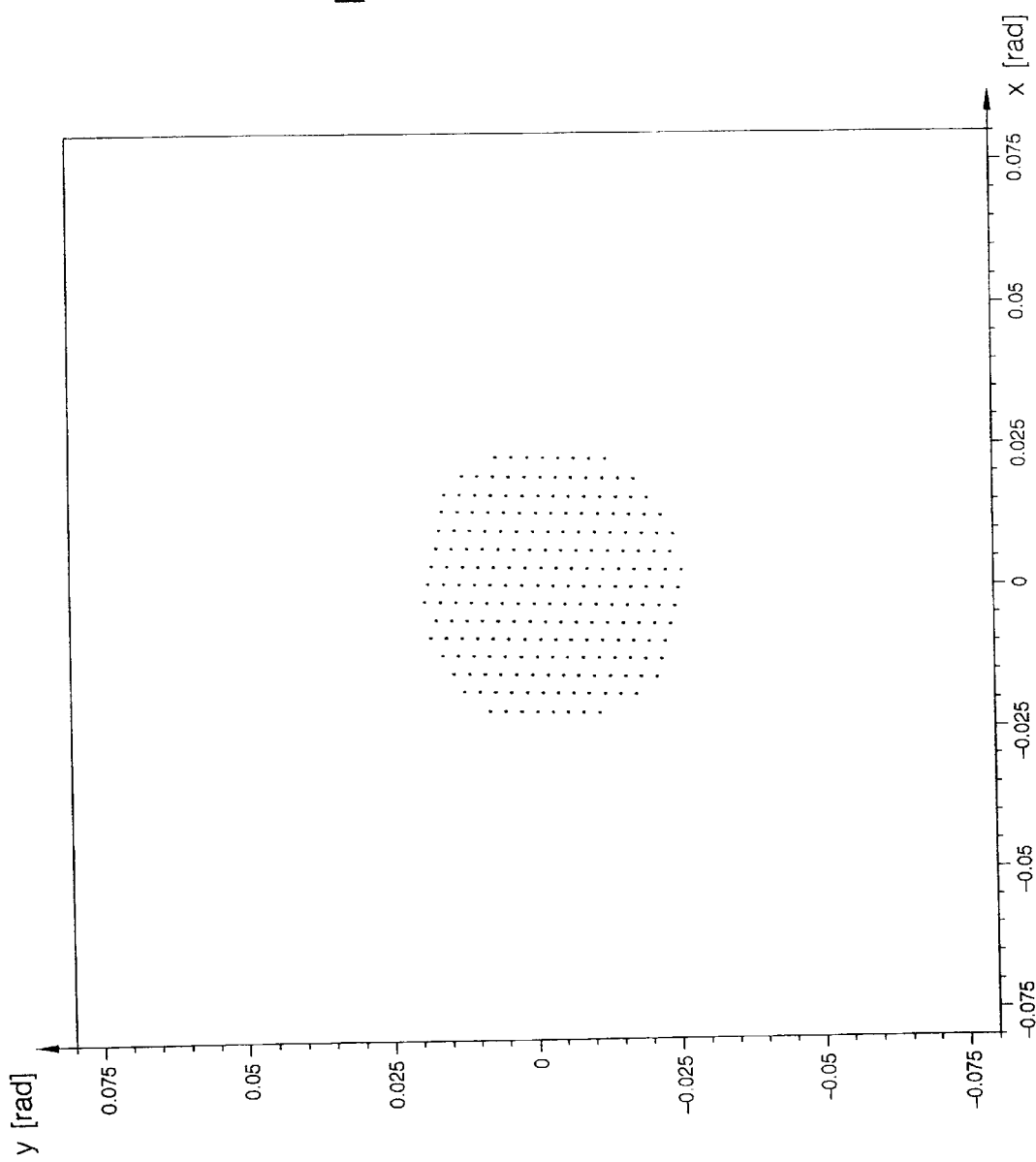

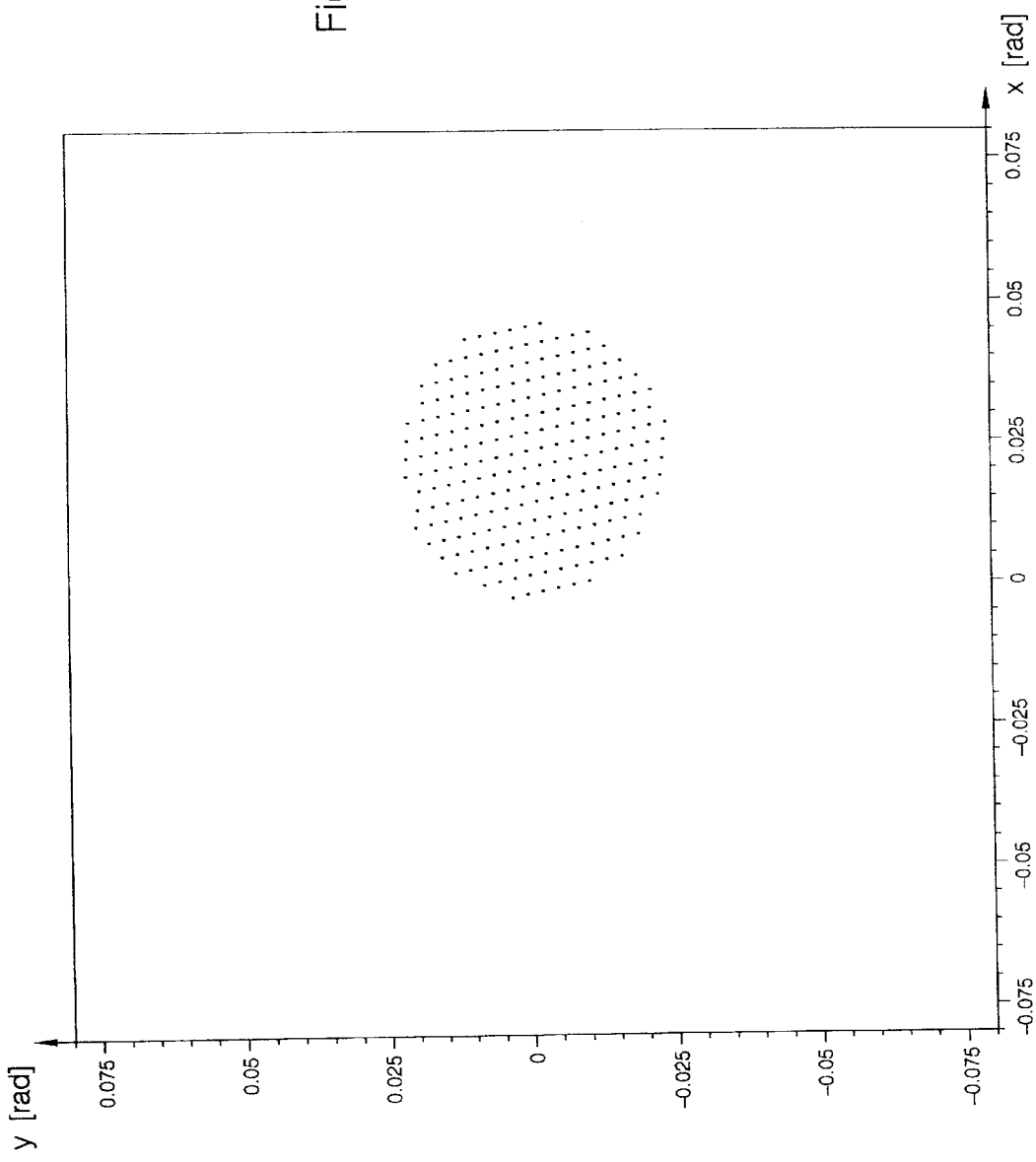

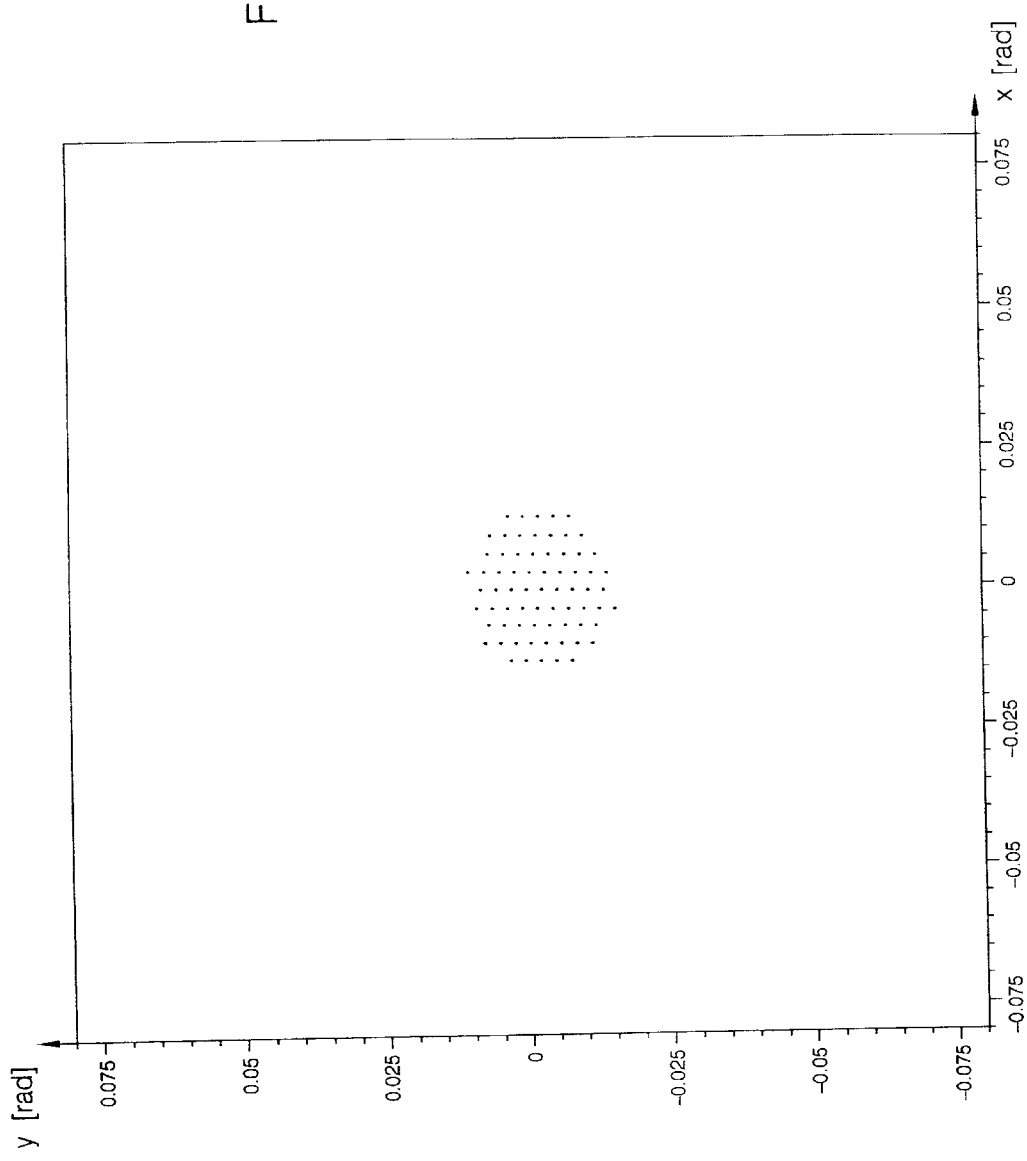

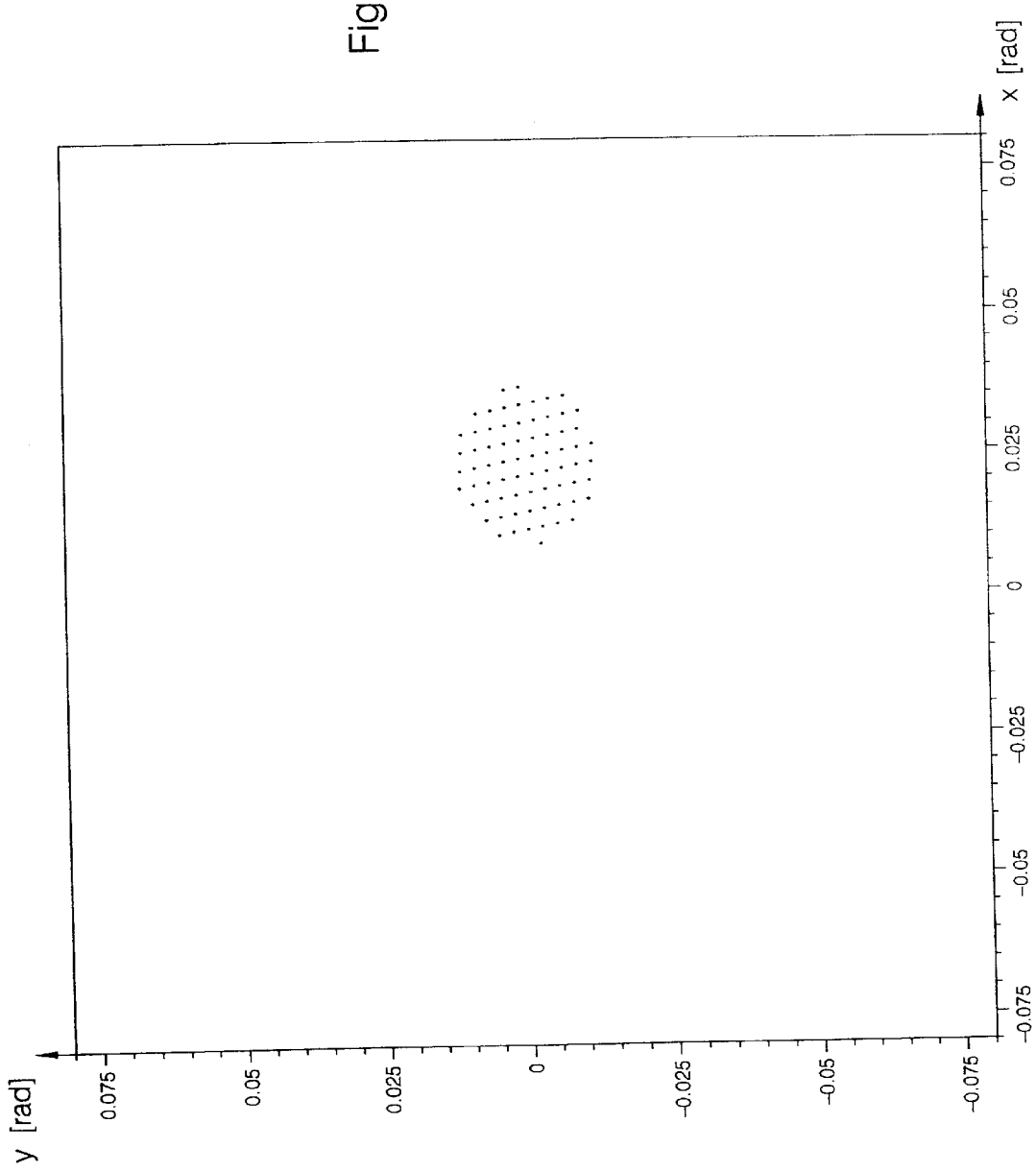

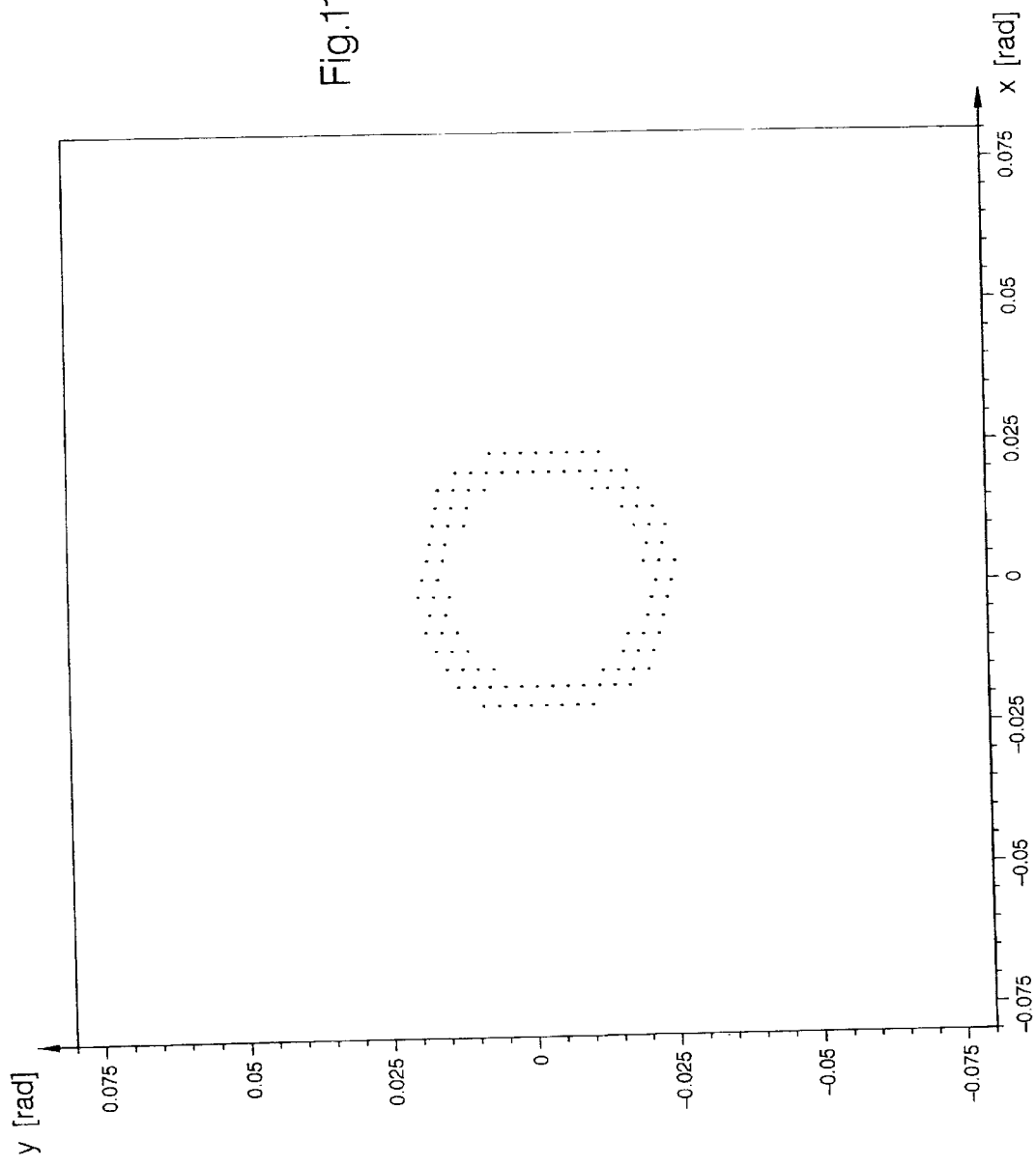

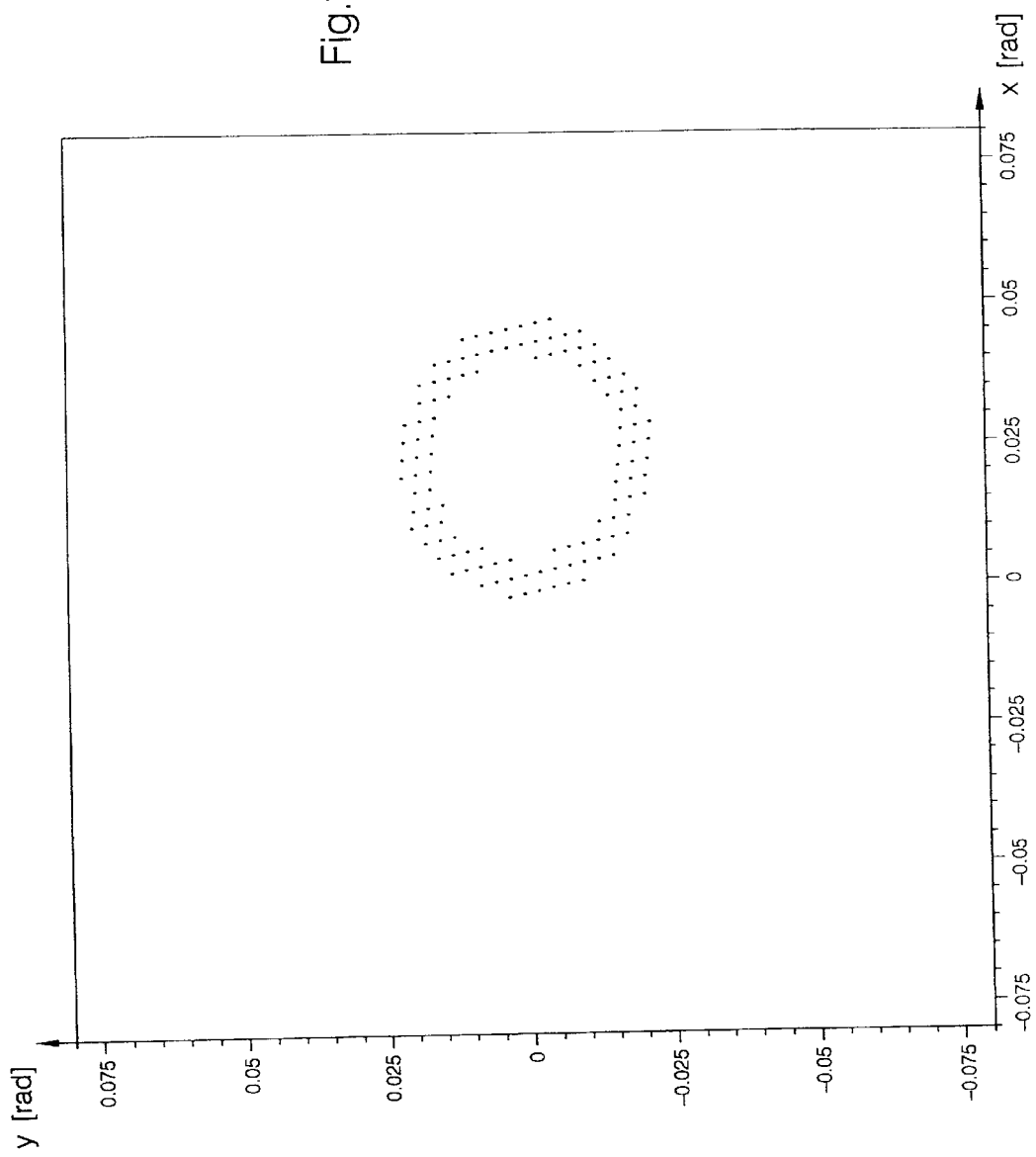

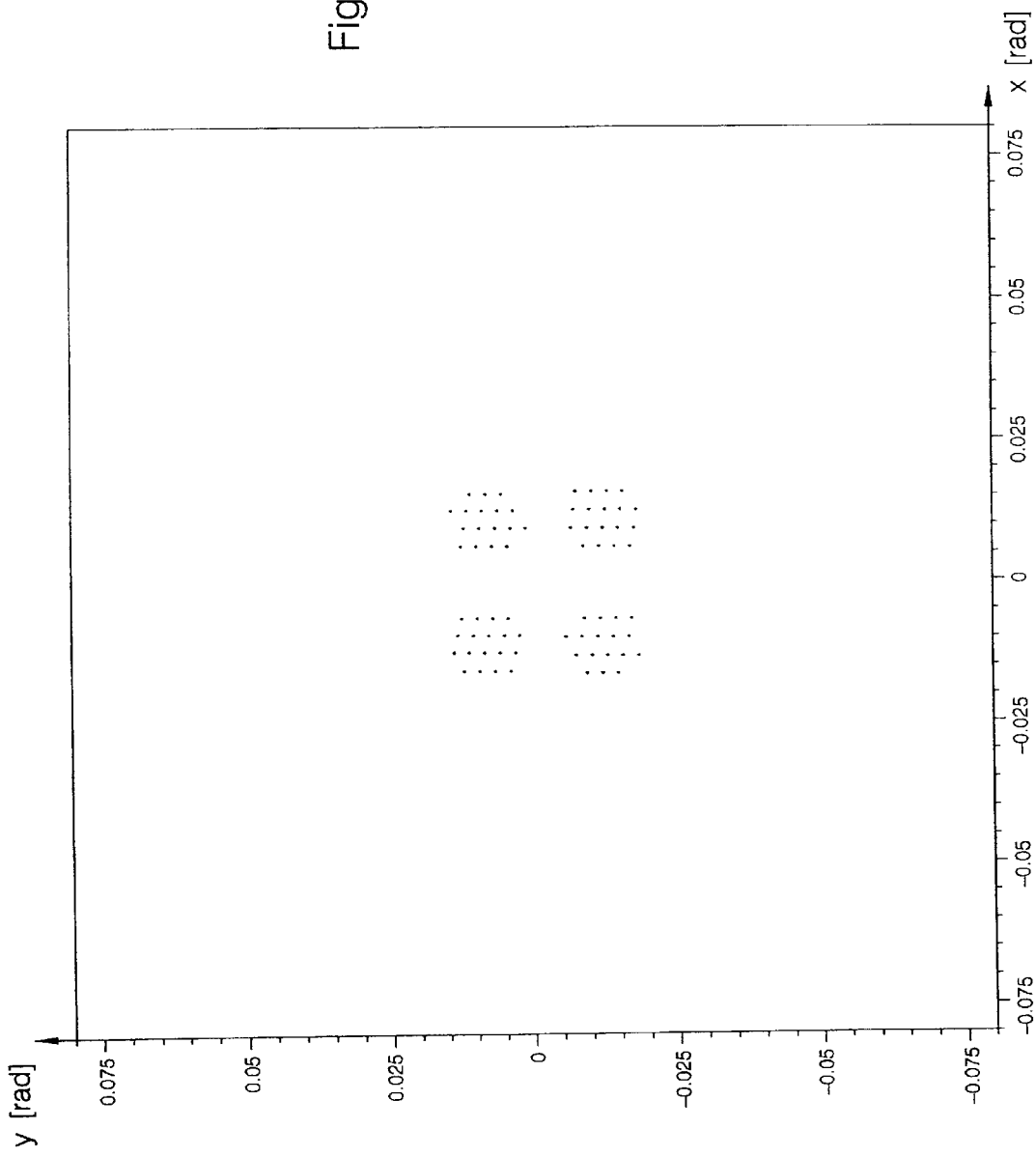

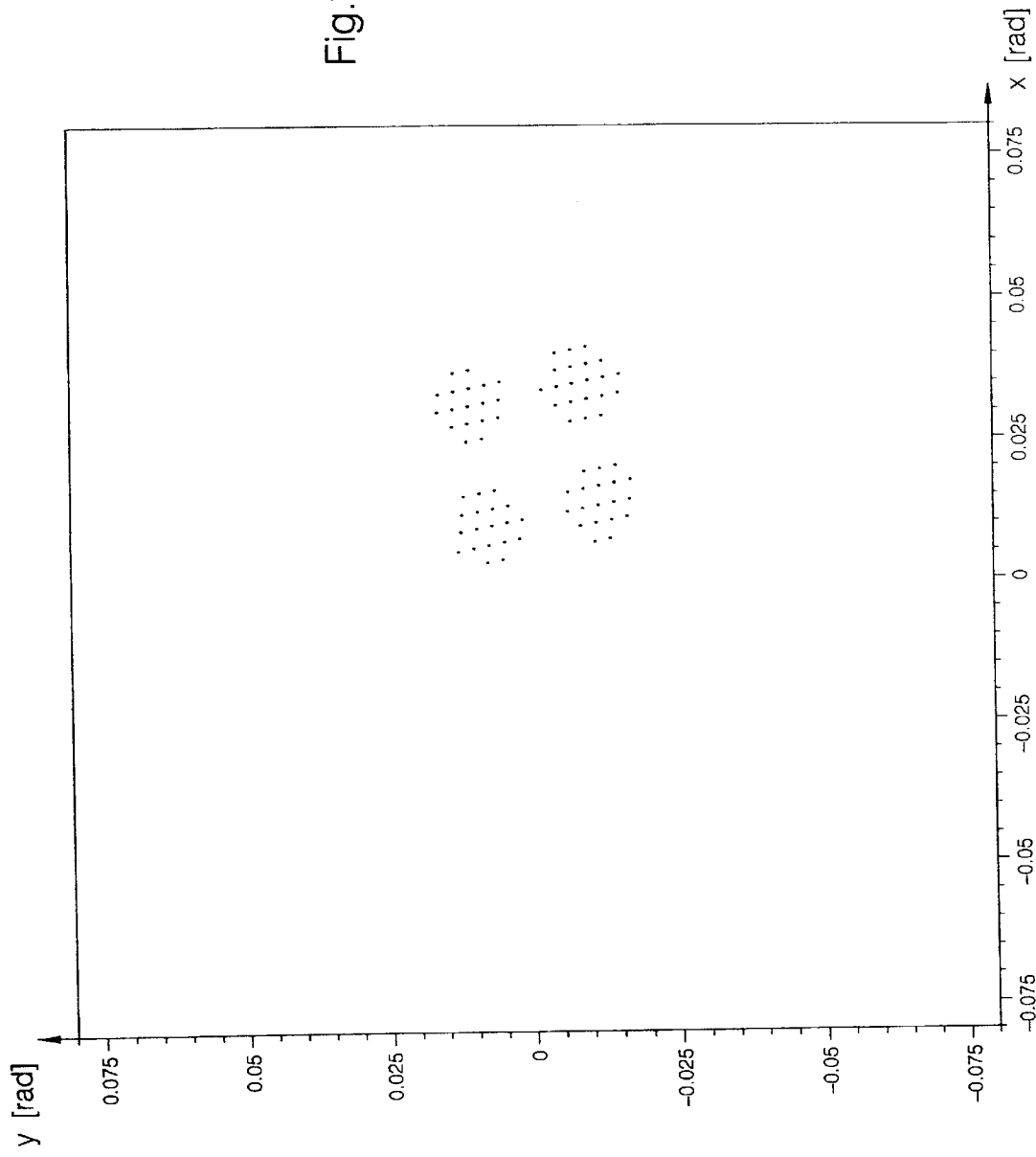

X in the reticle plane [mm]

X in the reticle plane [mm]

CONTROL OF A DISTRIBUTION OF ILLUMINATION IN AN EXIT PUPIL OF AN EUV ILLUMINATION SYSTEM

CROSS REFERENCE TO RELATED APPLICATIONS

The present application is a continuation of PCT/EP00/07160, which was filed on Jul. 26, 2000. PCT/EP00/07160 claimed priority of German Patent Application Serial No. 199 35 568.1, filed on Jul. 30, 1999, and German Patent Application Serial No. 299 15 847.0, filed on Sep. 9, 1999.

BACKGROUND OF THE INVENTION

1. Field of the Invention

The invention concerns an illumination system, particularly one for lithography, for example, VUV and EUV lithography with wavelengths smaller than or equal to 193 nm, wherein the illumination system has at least one light source, means for producing secondary light sources, which comprises a mirror or lens with raster elements for producing secondary light sources, a real or virtual diaphragm plane, as well as one or more optical elements for imaging the real or virtual diaphragm plane in the exit pupil of the illumination system, and means for producing a predetermined light distribution in the exit pupil of the illumination system, as well as an illumination system for wavelengths of $\leq 193$ nm with at least one light source, an object plane, and a plane conjugated to the object plane between light source and object plane.

2. Description of the Prior Art

In order to be able to still further reduce the line widths for electronic components, particularly in the submicron range, it is necessary to reduce the wavelengths of the light used for microlithography.

Lithography with soft x-ray radiation such as has been made known from U.S. Pat. No. 5,339,346 at wavelengths of less than 193 nm.

In addition to illumination according to U.S. Pat. No. 5,339,346, which requires at least four paired mirror facets arranged symmetrically to the source, illumination systems can be provided, which operate, for example, by means of reflective raster element plates for the homogeneous illumination of the ring field of an exposure objective. Such systems have the advantage that the field of an objective is illuminated homogeneously with as few reflections as possible, and further that an illumination of the pupil that is independent of field is assured up to a specific filling degree.

Reflective raster element plates for EUV illumination systems have been made known from U.S. Pat. No. 5,581,605.

The disclosure contents of the above-mentioned publications U.S. Pat. No. 5,339,346 and U.S. Pat. No. 5,581,605 are incorporated to the full extent in the present application.

An increase in the resolution and depth of focus in VUV and EUV illumination systems is possible, if the illumination of the mask can be adjusted each time according to the mask pattern, i.e., according to the reticle to be illuminated. In the prior art, the control of the illumination settings was usually done with a diaphragm, which is arranged downstream to the mirror or to the lens with raster elements. In this respect, for example, refer to:

U.S. Pat. No. 5,526,093
JP-A-10 092,727
JP-A-10 275,771
JP-A-10 062,710
JP-A-09 063,943

An illumination system with an Hg lamp for wavelengths of >248 nm, in which a scanning diaphragm controls a predetermined quantity that impinges onto an optical integrator is arranged in front of the optical integrator, so that a specific light distribution results in a diaphragm plane, has been made known from JP-A-10-303,123.

U.S. Pat. No. 5,379,090 also shows an illumination system for wavelengths of >248 nm with an Hg lamp. The system according to U.S. Pat. No. 5,379,090 comprises a variable-focus or zoom objective with which the size of the secondary light source is adjusted. In addition, a diaphragm is used for forming the light distribution on the mask to be illuminated.

Another illumination system for wavelengths of >248 nm with an Hg lamp has been made known from U.S. Pat. No. 5,363,170. The system according to U.S. Pat. No. 5,363,170 comprises an optical integrator, which is variably illuminated by means of a variable-focus or zoom objective, in order to be able to influence in this way the secondary light sources and thus the illumination in the reticle plane.

DE-A-197 16,794 shows a device for near-type microlithography, which is designed for wavelengths of >248 nm, with an optical integrator and an optical system for forming a beam. The optical system for forming a beam is arranged in front of the optical integrator and serves for the purpose of forming an elliptical cross-sectional profile, which is adapted to the elliptical profile of the aperture.

U.S. Pat. No. 5,305,054 shows another illumination system for wavelengths of >248 nm with an optical integrator. In the system according to U.S. Pat. No. 5,305,054, means for splitting the light beam into four light bundles in order to form a quadrupolar illumination are provided in front of the optical integrator.

All of the systems of the prior art for wavelengths of >248 nm are characterized by the use of purely refractive optical components, and in particular the optical integrators made known from these systems comprise refractive raster element condensers or optical elements with raster elements.

An EUV illumination system with undulator light source has been made known from U.S. Pat. No. 5,896,438, in which an optical integrator can be illuminated with reflective raster elements by means of a scanning mirror. The reflective raster elements of the optical integrator made known from U.S. Pat. No. 5,896,438, have a small aspect ratio of the raster elements and the raster elements are square. The object of the scanning mirror in this illumination device is to increase coherence by an angular scanning of the EUV light beam. To what extent the quality of the mask illumination, i.e., the illumination of the reticle, is influenced by introducing a scanning mirror, has not been made known from U.S. Pat. No. 5,896,438.

The disclosure content of U.S. Pat. No. 5,896,438 is incorporated to the full extent in the disclosure content of the present application.

EUV illumination systems with mirrors comprising a plurality of raster elements, also known as raster elements, which include means for producing a predetermined light distribution in the exit pupil, are known from the post-published document:

WO 99/57732.

It was a disadvantage in the EUV system from the prior art that the control of the light distribution in the diaphragm plane with masks was associated with a considerable loss of light or could not achieve the necessary uniformity in the object plane or reticle plane, since the intermixing or the number of illuminated raster elements was too small.

SUMMARY OF THE INVENTION

The object of the invention is to provide an EUV illumination system, with which the disadvantages in the prior art that are indicated above can be avoided. In particular, a system will be provide in which it is possible to control the light distribution in the exit pupil of the illumination system with simultaneous homogeneous illumination of the object plane or the reticle plane for any desired VUV and EUV sources.

In a first embodiment of the invention, in an EUV illumination system, it is provided that a number of raster elements, also know as grid elements or honeycombs, will be illuminated by the means for producing a defined illumination distribution in the exit pupil, so that a predetermined uniformity is achieved in the object plane.

In an alternative embodiment of the invention, in an illumination system that has a plane conjugated to the object plane, it is provided to arrange means for producing a predetermined light distribution in the vicinity of or in the plane conjugated to the object plane.

The following are currently discussed as light sources for EUV illumination systems:

Laser plasma sources

Pinch plasma sources

Synchrotron radiation sources.

In laser-plasma sources, an intensive laser beam is focused on a target (solid, gas jet, droplets). By excitation, the target is heated so intensely that a plasma is formed. This plasma emits EUV radiation.

Typical laser plasma sources have a spherical irradiation, i.e., a beaming angular range of $4\pi$ as well as a diameter of 50 $\mu$m–200 $\mu$m.

In pinch plasma sources, the plasma is produced by means of electrical excitation Pinch plasma sources can be described as volume radiators (Ø=1.00 mm, which irradiate in 4 $\pi$, wherein the radiation characteristic is given by the source geometry.

In synchrotron radiation sources, three types of sources can be currently distinguished:

(1) bending magnets (2) wigglers (3) undulators.

In bending magnet sources, the electrons are deflected by a bending magnet and emit photon radiation.

Wiggler sources comprise a so-called wiggler, which is made of a plurality of magnet pairs arranged in rows of alternating polarity, for deflecting electrons or an electron beam. If an electron passes through a wiggler, then the electron is subjected to a periodic, vertical magnetic field; the electron oscillates correspondingly in the horizontal plane. Wigglers are further characterized by the fact that coherence effects do not occur. The synchrotron radiation produced by means of a wiggler is similar to that of a bending magnet and radiates into a horizontal solid angle element. In contrast to the bending magnet, the wiggler has a flux enhanced by the number of poles that it has.

There is no clear dividing line between wiggler sources and undulator sources

In undulator sources, the electrons in the undulator are subjected to a magnetic field with a shorter period and smaller magnetic field of the deflecting poles than in the wiggler, so that interference effects of synchrotron radiation occur. The synchrotron radiation has a discontinuous spectrum due to the interference effects and irradiates both horizontally as well as vertically in a small solid-angle element; i.e., the radiation is strongly directional.

With respect to the construction of EUV illumination systems in principal, reference is made to the pending application EP 99 106348.8, filed on Mar. 2, 1999, with the title "illumination system, particularly for EUW lithography"; U.S. Ser. No. 09/305,017 filed on May 4, 1999, with the title "Illumination system particularly for EUV lithography"; and WO 99/57732, filed on May 4, 1999, with the title "Illumination system, particularly for EUV lithography" of the Applicant, the disclosure content of which is incorporated in its entirety in the present application.

It is provided in an advantageous embodiment of the invention that the means for producing the light distribution comprise a scanning mirror, such as, for example, the one in U.S. Pat. No. 5,896,438. Preferably, such a scanning mirror can be controlled.

The use of a scanning mirror has the advantage of a loss-free control of the illumination distribution. In particular, scanning mirrors are used for light sources with a small Entendu, for example, undulator light sources. In such systems scanning mirrors are used for increasing the Entendu.

In a system without a plane conjugated to the object plane between light source and object plane, illumination can be produced appropriately by a corresponding control of the scanning movement of the mirror with raster elements in order to produce secondary light sources. Alternatively to a scanning mirror, an optical system with a zoom effect can be arranged in front of the mirror with raster elements. With such an optical system, variable focal lengths can be illuminated by displacement of individual optical components if the image plane, which is here the plane in which the mirror with raster elements is situated, is held constant.

In another advantageous form of embodiment of the invention for systems without a conjugated plane, relative to the object plane, for producing a light distribution of predetermined size, the entire collector unit comprising of optical elements of positive and/or negative refractive power, for example, of divergent mirrors or convergent lenses can be changed in total.

With such an embodiment it is possible to illuminate a larger or smaller circle on the mirror with raster elements, which also can be denoted as field raster element plate.

The means for producing a specific light distribution in another embodiment of the invention may comprise a mirror or a lens with deformable surface, which is used both for systems with a plane conjugated to the object plane as well as for those without this plane.

Mirrors with deformable surface have been made known, for example, from JP-A-51 0097 or from U.S. Pat. No. 5,825,844, wherein the disclosure content of these publications is fully incorporated into the present application.

In JP-A-51 00097, the surface deformation is stimulated by means of piezoelectric crystals. Therefore, a plurality of manipulators is introduced on the underside of the mirror. An electromagnetic excitation has also been made known from U.S. Pat. No. 5,825,844, in addition to excitation with piezoelectric crystals.

The deformable mirror for producing a predetermined light distribution in the exit pupil can be arranged, for example, in the collector unit; in illumination systems with intermediate image, i.e., with a plane conjugated to the object plane or reticle plane, the deformable mirror may also be arranged in this plane.

There are a multiple number of possibilities for light distribution in the exit pupil. In a first embodiment of the invention, it is provided that the exit pupil is illuminated circularly. Alternative to a circular illumination, a ring-shaped illumination or a quadrupole illumination can be provided.

In order to assure the uniformity of field illumination in systems in which the field has a high aspect ratio, it is advantageously provided that the raster elements of the mirror or lens for producing secondary light sources comprise field raster elements with an aspect ratio that is smaller than the aspect ration of the field and are, for example, of cylindrical and/or toroidal shape In this way, the number of incompletely illuminated field raster elements is reduced. With respect to the effect of such systems, reference is made to the pending application DE-A-199 31 848.4, filed on Jul. 9, 1999, with the title: "Components with anamorphotic effect for reducing the raster element aspect ratio in EUV illumination systems", the disclosure content of which is incorporated to the full extent in the present application.

The uniformity, i.e., variation of the intensity distribution within a pregiven field in the object plane or reticle plane, which can be achieved by means of the device according to the invention, is <10%, preferably <5%, and most preferably <1%. Whereas in stepper systems, the uniformity of the intensity distribution is considered within a pregiven field, in the case of scanner systems, the uniformity of the scanning energy must be given for each field point perpendicular to the scanning direction.

In addition to the illumination system, the invention also makes available an EUV projection system with such an illumination system, as well as a method for producing microelectronic components.

BRIEF DESCRIPTION OF THE DRAWINGS

The invention will be described in more detail below on the basis of examples of embodiment.

Here:

FIGS. 2C–2D show an embodiment of a structure according to FIG. 1A or 1B with a deformable mirror in the collector unit, two states of the deformable mirror are shown;

FIG. 2E shows an illumination system with a second mirror with raster elements;

FIG. 2F shows an illumination system with a second mirror with raster elements, wherein the second mirror with raster elements is different from that in FIG. 2E;

FIG. 6C shows the annular illumination of the field raster element plate with a filling factor of:

$$\frac{\sigma_{out}}{\sigma_{in}} = \frac{1.0}{0.7}$$

Figure 6A:
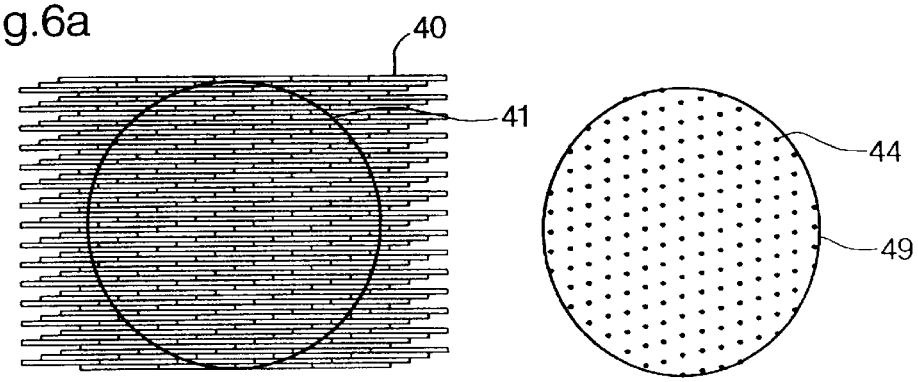
FIG. 6A shows the illumination of the field raster element plate with a filling factor of σ=1.0.
Figure 6B:
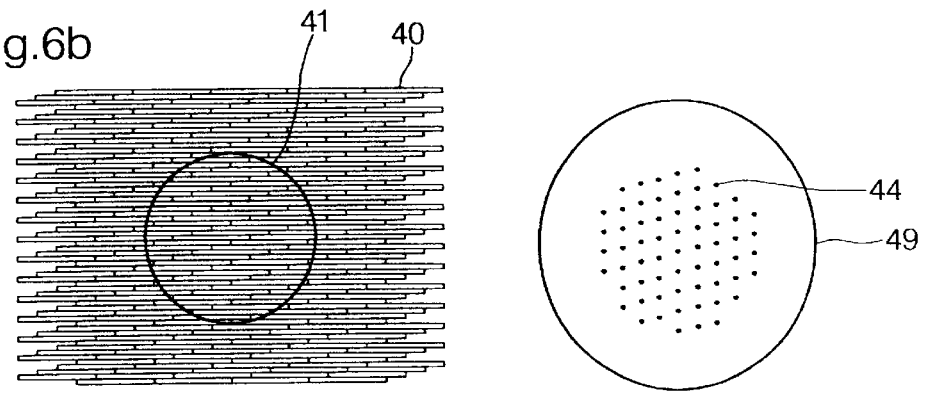
FIG. 6B shows the illumination of the field raster element plate with a filling factor of σ=0.6.
Figure 6C:
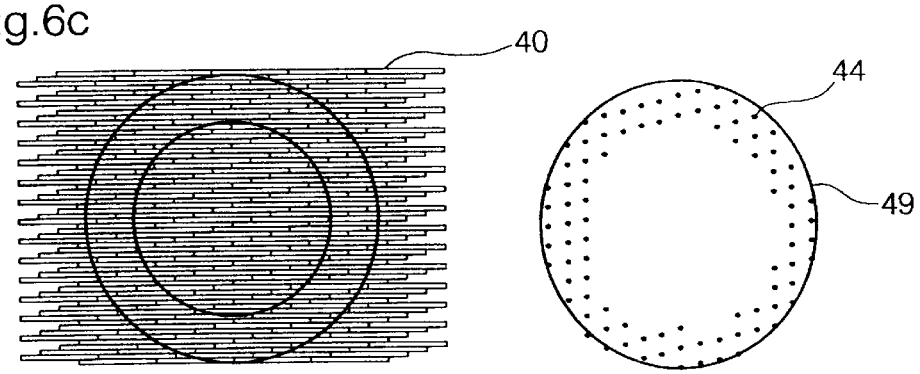
Figure 6D:
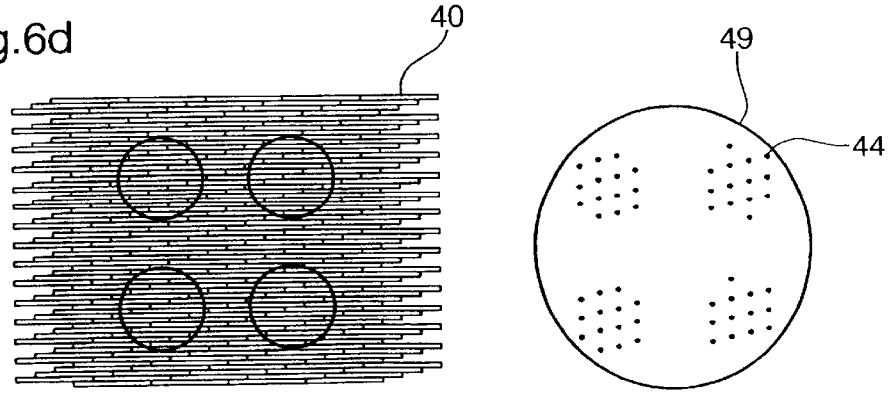

FIG. 6D shows the illumination of the field raster element plate with quadrupolar illumination;

FIG. 7 shows the pupil illumination for σ=1.0 for the field point on the optical axis;

FIG. 8 shows the pupil illumination for σ=1.0 for the field point at the edge of the field (x=40, y=4.04);

FIG. 9 shows the pupil illumination for σ=0.6 for a field point on the optical axis;

FIG. 10 shows the pupil illumination for σ=0.6 for a field point at the edge of the field (x=40, y=4.04).

Figure 15:
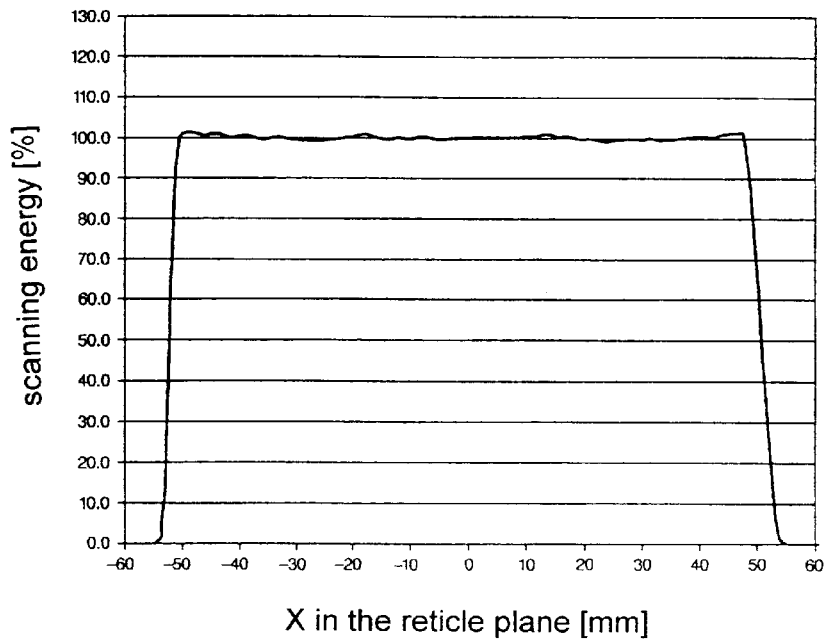
Figure 16:
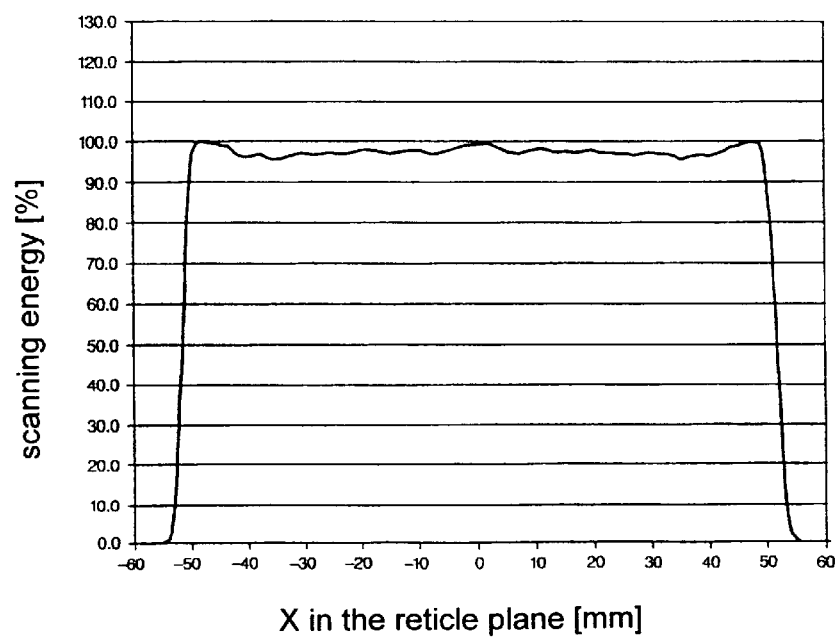
Figure 17:
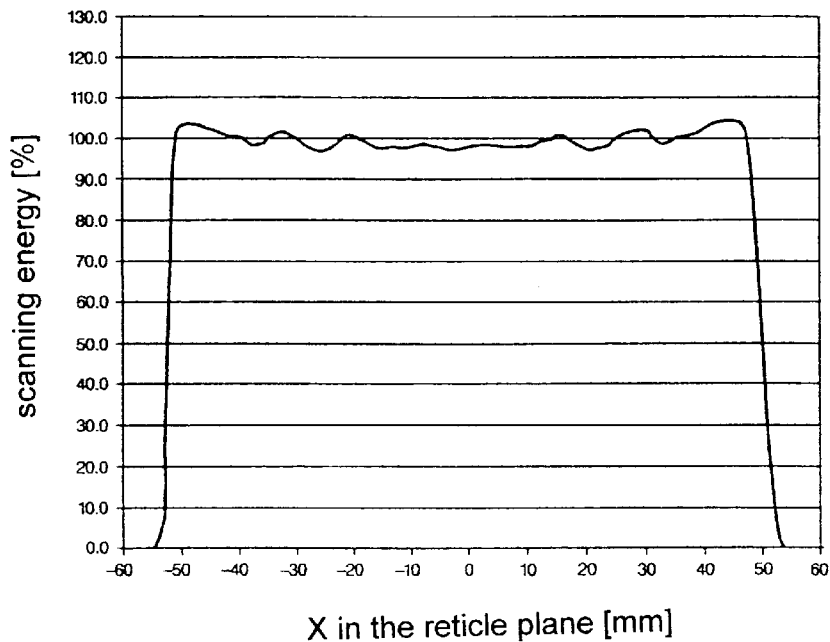
Figure 18:
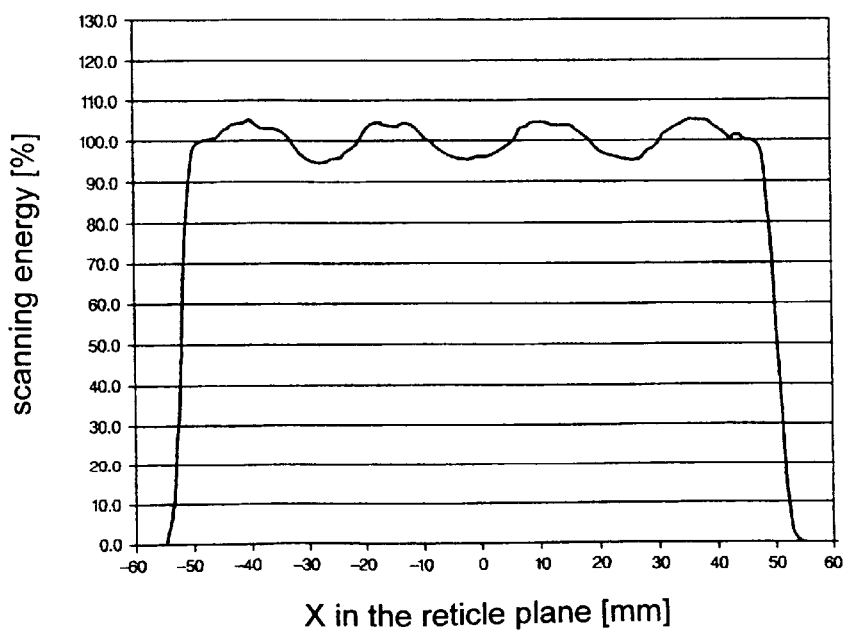
Figure 19:
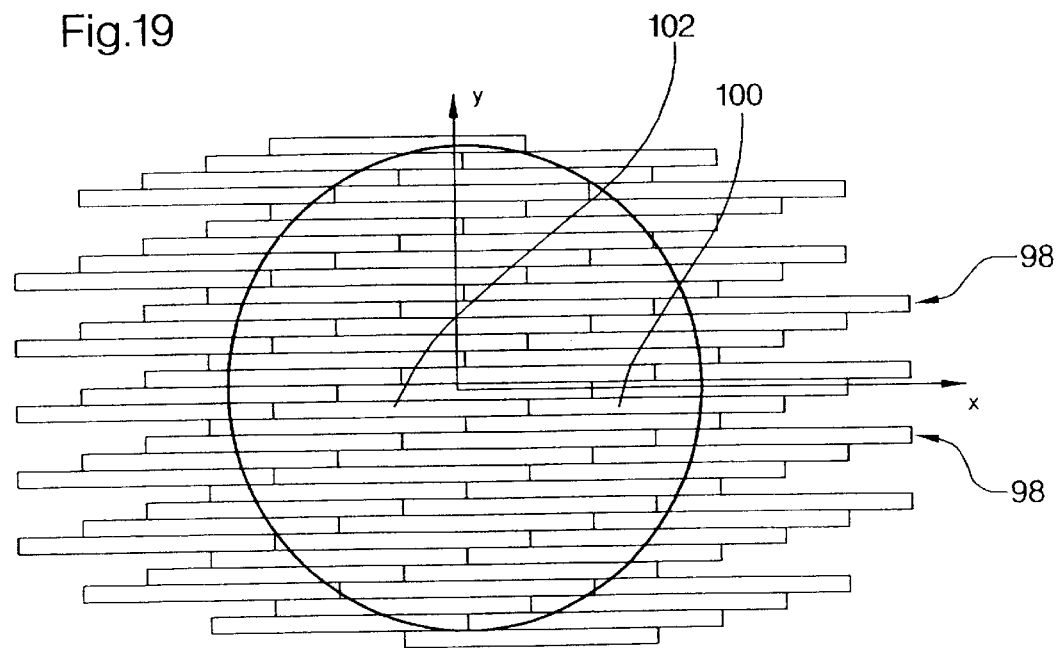
Figure 20:
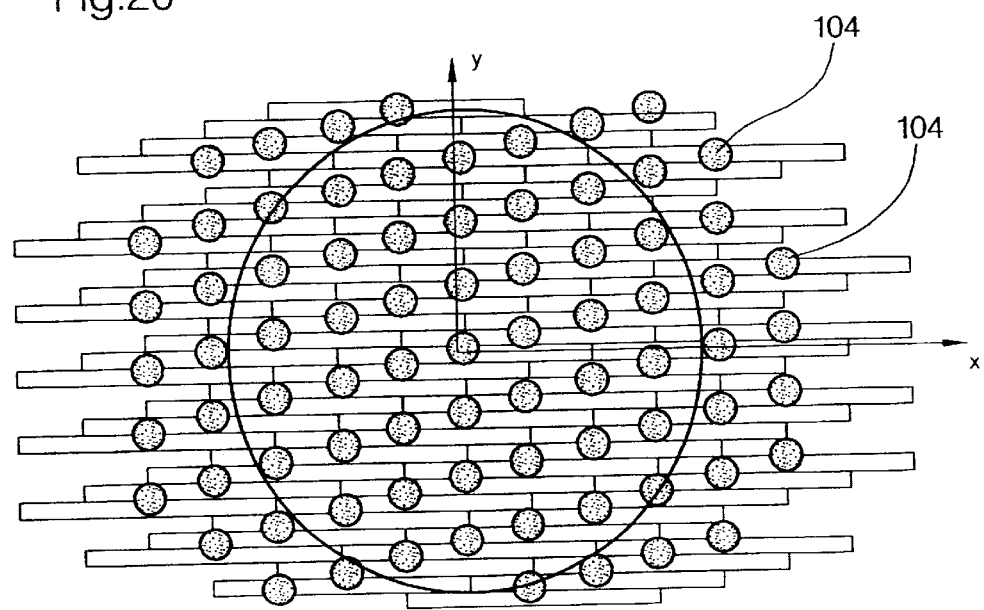
Figure 21:
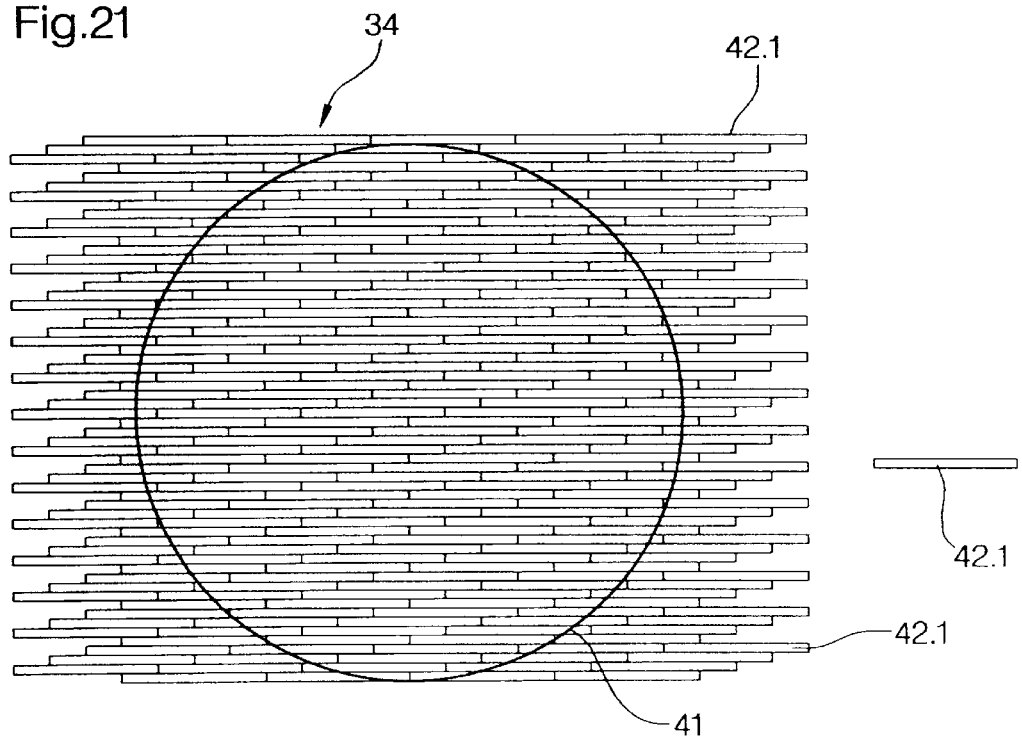
Figure 22:
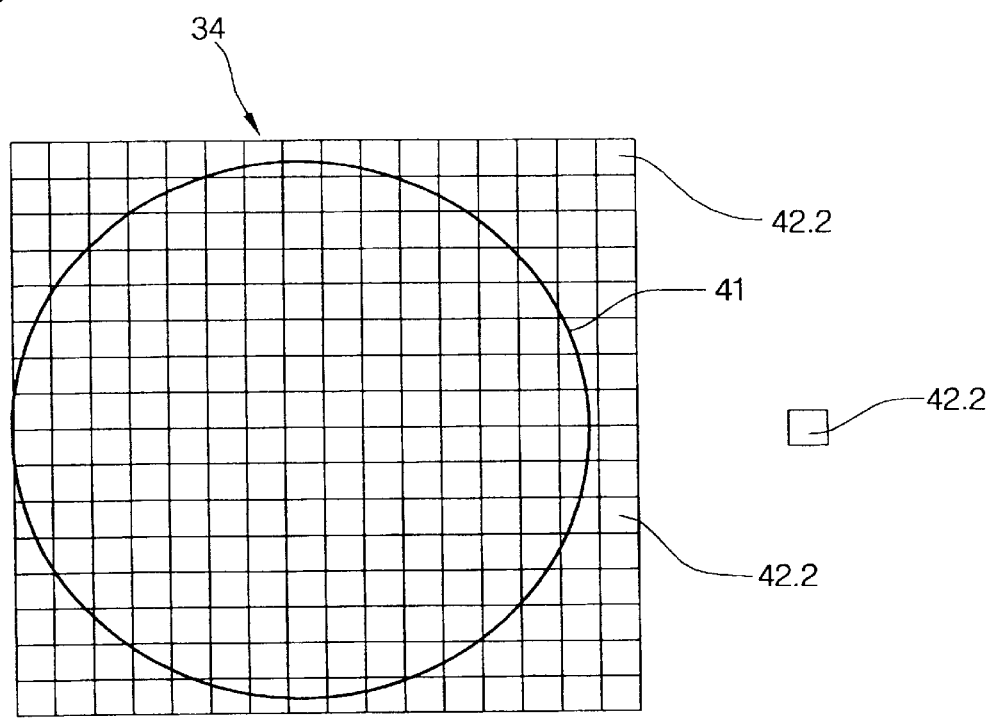

FIG. 11 shows the pupil illumination in the case of annular illumination for a field point on the optical axis;

FIG. 12 shows the pupil illumination in the case of annular illumination for a field point at the edge of the field (x=40, y=4.04);

FIG. 13 shows the pupil illumination in the case of quadrupolar illumination for a field point on the optical plane;

FIG. 14 shows the pupil illumination in the case of quadrupolar illumination for a field point at the edge of the field (x=40, y=4.04);

FIG. 15 shows the integral scanning energy in the reticle plane in the case of an illumination distribution with σ=1.0 in the exit pupil;

FIG. 16 shows the integral scanning energy in the reticle plane in the case of an illumination distribution with σ=0.6 in the exit pupil;

FIG. 17 shows the integral scanning energy in the reticle plane for an annular illumination distribution;

FIG. 18 shows the integral scanning energy in the reticle plane in the case of quadrupolar illumination distribution;

FIG. 19 shows a system with raster elements with an aspect ratio of 17.5:1 arranged on a raster element plate;

FIG. 20 shows the light distribution in the diaphragm plane of the illumination system in the case of an arrangement of field raster elements on the raster element plate according to FIG. 19;

FIG. 21 shows the field raster element plate with raster elements with an aspect ratio of 17.5:1; and FIG. 22 shows the field raster element plate with r aster elements with an aspect ratio of 1:1.

DESCRIPTION OF THE INVENTION

Figure 1A:
FIGS. 1A and 1B show the principal structure of an illumination system with an undulator unit as the illumination source.
Figure 1B:
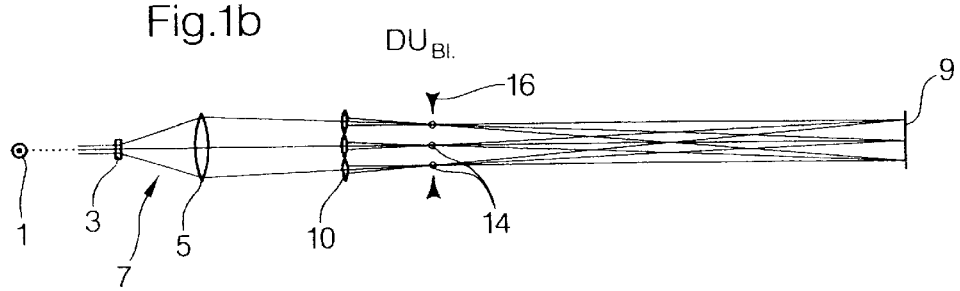

For example, the basic or principal structure of an EUV illumination system with a synchrotron radiation light source is shown in FIGS. 1A and 1B, where it is depicted as an undulator, but the invention is not limited to this structure.

Undulator sources have a beam divergence of <100 mrad, preferably of <50 mrad in a predefined plane in which a predetermined wavelength spectrum is irradiated. In case the light source is an extended light source, it may be necessary to provide a second mirror or a second lens with raster elements at the site of the secondary light sources, in order to correctly image the raster elements of the first mirror or lens in the reticle plane. The raster elements of the first mirror or of the first lens are denoted field raster elements, and the raster elements of the second mirror or the second lens are denoted pupil raster elements.

An EUV illumination system is shown in FIGS. 1A and 1B in a refractive representation for explaining the principle of the system. The beam that is emitted from radiation source 1 is expanded presently by means of a divergent lens 3 or a divergent mirror, without the invention being limited to this.

As far as the structure of illumination systems is concerned, reference is made to the pending applications EP 99 106348.8, filed on Mar. 2, 1999, with the title "illumination system, particularly for EUV lithography"; U.S. Ser. No. 09/305,017, filed on May 4, 1999, with the title "Illumination system particularly for EUV lithography "; as well as WO 99/57732, filed on May 4, 1999, with the title "Illumination system, particularly for EUV lithography" of the Applicant, the disclosure content of which is incorporated to the full extent in the present application.

The collecting or convergent effect for producing secondary light source 12 is introduced by the collecting mirror or convergent lens 5 arranged downstream to the divergent lens or divergent mirror 3. The means for broadening the beam and the mirror or the lens with convergent effect form a so-called collector unit or a collector system 7. Without the mirror with raster elements, collecting mirror 5 would image source 1 in the image plane 9 of the illumination system, as shown in FIG. 1A, onto secondary light source 12. With the presence of the mirror with raster elements 10 or the facetted mirror, the secondary light source 12 is split into a plurality of secondary light sources 14, so that a plurality of secondary light sources 14 are produced in the diaphragm plane 16, as shown in FIG. 1B. Raster elements 10 thus have a convergent effect. Raster elements 10 of the first mirror are also denoted below as field raster elements.

If the illumination systems depicted in FIGS. 1A and 1B as refractive systems are designed, e.g., for EUV-radiation, then they must be converted to reflective systems for, e.g., 13-nm radiation. Due to the high reflection losses, such systems must be designed with as few reflections as possible.

For an undulator source, the collector unit in the case of 13-nm radiation may comprise a first grazing-incidence mirror or a scanning mirror, which expands the radiation, and a second, normal-incidence mirror, which again acts collectively or convergently on the radiation. The advantage of the scanning mirror lies in the fact that the magnitude of illumination can be varied therewith.

In order to obtain an advantageous design for 13-nm wavelengths, grazing-incidence mirrors (R≈80%) are preferred over normal-incidence mirrors (R≈65%) due to the higher reflectivity.

Advantageously, the source irradiates in the horizontal direction.

The optical elements that are arranged downstream to the mirrors with raster elements, that is, in the light path after the mirrors with raster elements, serve for the purpose of imaging the diaphragm plane of the illumination system into the exit pupil of the illumination system, which coincides in the present case with the entrance pupil of the projection objective. Furthermore these optical elements form the ring field and serve for the purpose of producing a required illumination distribution.

In the case of stepper systems, a uniformity of <10%, preferably <5%, most preferably <1% of the intensity distribution within a predetermined field is In this application the uniformity of the intensity distribution E(x, y) is defined as follows:

$$\text{uniformity} = \frac{(E_{\max} - E\min)}{(E_{\max} + E_{\min})} \times 100\%$$

wherein $E_{max}$ is the maximal intensity and $E_{min}$ is the minimal intensity within the predetermined field.

In the case of scanners systems, a uniformity of the scanning energy of <10%, preferably less than 5%, and most preferably <1%, is required. The scanning energy SE(x), is defined as a line integral:

$$SE(x) = \int E(x,y) dy$$

wherein E(x, y) is the intensity distribution in the x-y plane, along the scanning direction, which is, for example, the y-direction. Each point on the wafer corresponds to a scanning energy SE(x) corresponding to its x-coordinate.

The uniformity of scanning energy is defined in this application as follows:

$$\text{uniformity} = \frac{(SE_{\max} - SE\min)}{(SE_{\max} + SE_{\min})} \times 100\%$$

wherein $SE_{max}$ is the maximum scanning energy and $SE_{min}$ is the minimum scanning energy along the scanning path.

Figure 2A:
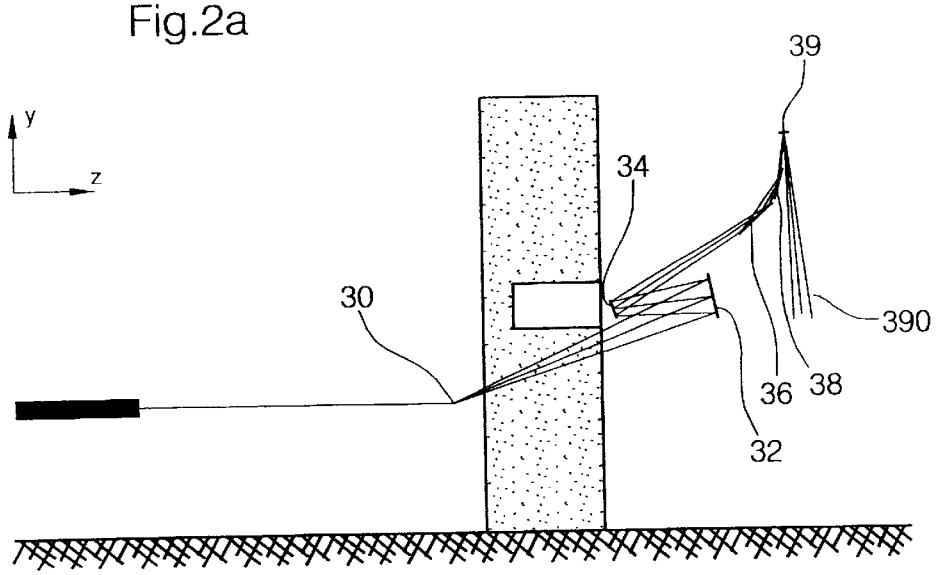
FIG. 2A shows an embodiment of a structure according to FIG. 1A or 1B.

An illumination system for 13-nm radiation with a synchrotron radiation source, in this case an undulator, is shown in FIG. 2A in schematic representation.

The system comprises a collector mirror 30, which is formed as a grazing-incidence toroidal mirror, which expands the beam bundle, and a normal-incidence collector mirror 32, which illuminates the mirror with raster elements 34.

Field mirrors 36, 38 are formed as grazing-incidence field mirrors. They form the field in reticle plane 39 and image the diaphragm plane in the exit pupil.

Figure 2B:
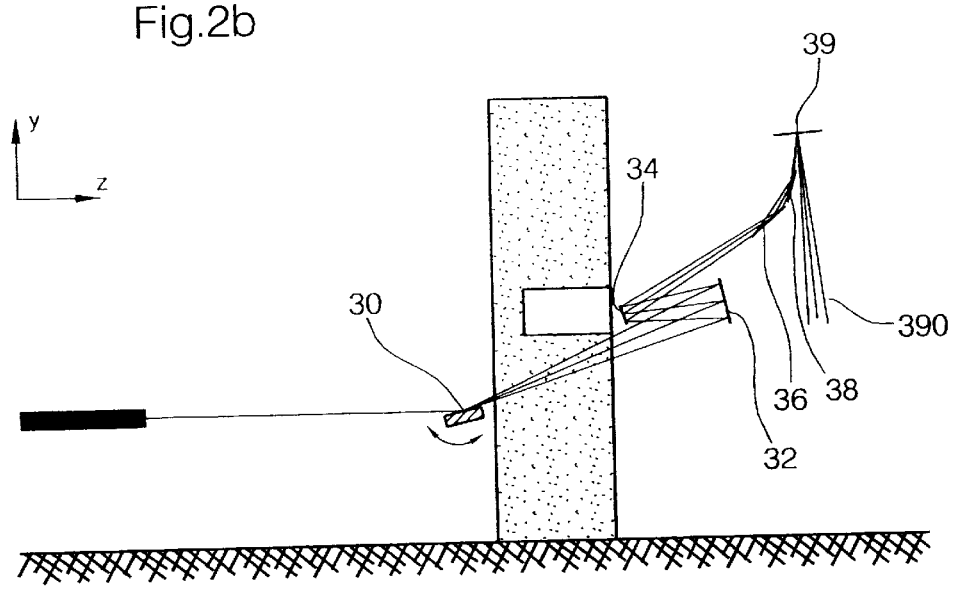
FIG. 2B shows an embodiment of a structure according to FIG. 1A or 1B with a scanning mirror.

The same arrangement as in FIG. 2A is shown in FIG. 2B, but mirror 30 is formed as a scanning mirror for the variable illumination of the mirror with raster elements or field raster elements 34.

A schematic representation of an illumination system according to FIG. 1A or 1B without intermediate image is shown in FIGS. 2C and 2D, in which the collector mirror 30, which expands the beam emitted from the synchrotron radiation source, for example, an undulator source, is a mirror with deformable surface.

By this, the illumination can be controlled on collector mirror 32 and thus also on mirror 34 with field raster elements. For example, the variation of the illumination distribution for an illumination system with undulator source will be shown below. The undulator source irradiates with a horizontal divergence of ±1 mrad and a vertical divergence of ±0.3 mrad. Collector mirror 30 is found at a distance of 5000 mm. The tilt angle of collector mirror 30 amounts to 80°. Collector mirror 32, whose tilt angle amounts to 5° follows 3000 mm downstream.

The field raster element plate, i.e., the mirror with field raster elements 34 is found at a distance of 650 mm from collector mirror 32. In order to completely fill the entrance pupil of the downstream objective, i.e., σ=1.0, the field raster element plate 34 must be illuminated up to a diameter of 64 mm. This corresponds to the state in FIG. 2C.

Then, in order to achieve a complete filling of σ=1.0, in the case of the above-described illumination system, toric collector mirrors 30, 32 with the following radii are necessary:

|  | $R_x$ [mm] | $R_y$ [mm] |
|---|---|---|
| collector mirror 30 | −156.6 (divergent) | −1373.5 (divergent) |
| collector mirror 32 | 3138.0 (convergent) | 2967.9 (convergent) |

In order to obtain, for example, a filling degree of σ=0.3, the illuminated diameter must be reduced to 19.2 mm. This corresponds to the state in FIG. 2D. For this purpose, the radii of collector mirror 30 must be changed as follows by suitable manipulators:

|  | $R_x$ [mm] | $R_y$ [mm] |
|---|---|---|
| collector mirror 30 | −985.0 (divergent) | −5241.0 (divergent) |
| collector mirror 32 | 3138.0 (convergent) | 2967.9 (convergent) |

Whereas the radii of collector mirror 30 are modified, the radii of collector mirror 32 remain unchanged.

If collector mirror 30 is shaped as a mirror with deformable surface, then any desired filling degree between a σ=0.3 and σ=1.0 can be adjusted by deformation of the surface within the above-given radii. Therefore, the surfaces are not limited to purely toric surfaces. It is also possible to change the imaging properties by introducing conical or higher aspheric surface components.

Deformation is possible, for example, by a plurality of manipulators on the underside of the mirror. The manipulators may comprise piezoelectric elements and/or elements for electromagnetic excitation.

In another embodiment, one may exchange collector mirror 30. With changeable optics, i.e. an exchange of collector mirror 30, any filling degree between σ=0.3 and σ=1.0 can be adjusted. This means that just by changing one component of the optical system, collector mirror 30, the illumination of the exit pupil may be varied.

Another example of embodiment is shown in FIG. 2E in schematic representation. Components having the same function as components in FIGS. 2C and 2D are provided with the same reference numbers. The light of undulator light source 1 is expanded by the divergent collector mirror 30. The expanded beam bundle 360 illuminates a mirror 310 with raster elements, which is inserted after collector mirror 30. In addition to mirror 34 with field raster elements, there is another mirror 310 with raster elements. The raster elements of mirror 310 split the incident beam bundle 360 into individual beam bundles 370, wherein only one beam bundle 370 is depicted for a single raster element in FIG. 2E as an example. A concave condenser mirror 302 superimposes the individual beam bundle 370 on mirror 34 with field raster elements. In this way, a very homogeneous illumination of mirror 34 with field raster elements can be achieved. In the configuration according to FIG. 2E, mirror 34 with field raster elements is thus completely illuminated. Since the light rays impinging on mirror 34 with field raster elements have a larger divergence due to the insertion of the additional mirror 310 with raster elements, than without this insertion of mirror 310, another mirror 350 with raster elements is inserted after mirror 34 with field raster elements. This mirror 350 is situated at the site of the secondary light sources produced by the field raster elements. The raster elements of mirror 350, which are denoted pupil raster elements, image the field raster elements in reticle plane 39. Beam bundle 370 is reflected at reticle 39 and is depicted up to exit pupil 390 of the illumination system, which is simultaneously the entrance pupil of a subsequent projection objective, which is not shown in FIG. 2E. The illumination aperture at reticle 39, and the illumination of exit pupil 390, respectively, thus directly depends on the illumination of mirror 34 with field raster elements.

The illumination of mirror 34 with field raster elements in turn is given by mirror 310 with raster elements. This mirror may be exchanged in order to change the illumination of exit pupil 390. Mirror 310 can be exchanged manually by means of a change wheel or by means of a robot arm. The illumination in exit pupil 390 can thus be changed by changing a single optical element. A mirror 320 with raster elements, which is different from mirror 310, is used in FIG. 2F, and this mirror 320 only partially illuminates mirror 34 with field raster elements. Thus the aperture at reticle 39 is also reduced in comparison to FIG. 2E and the extent or dimension of the illumination of exit pupil 390 is reduced.

Figure 2G:
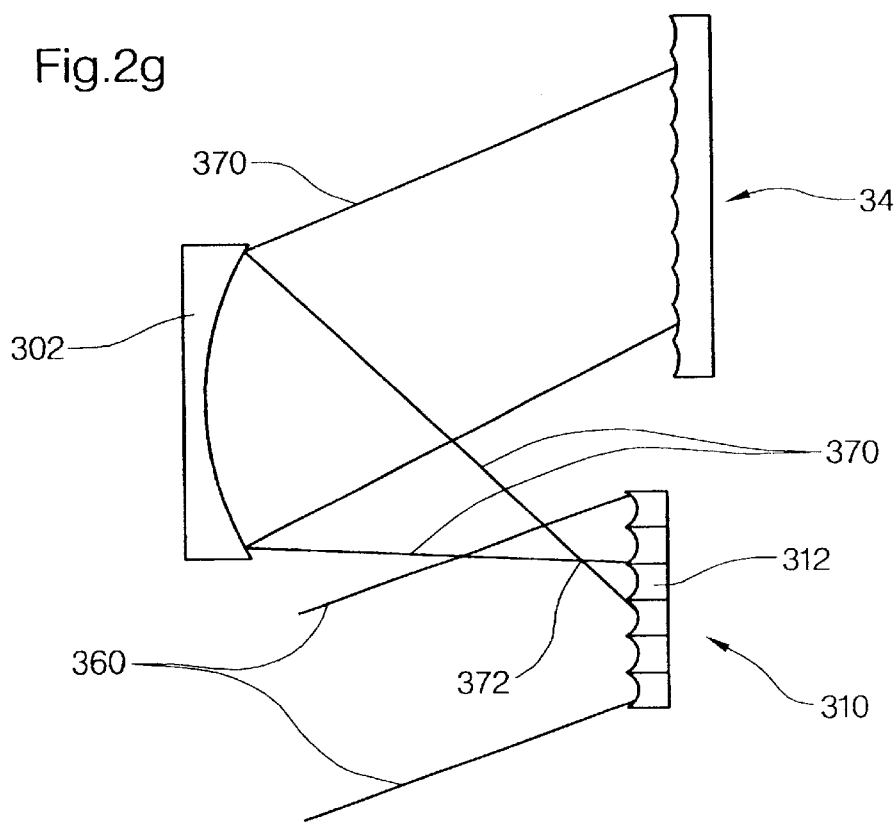
FIG. 2G and FIG. 2H show sections from the system according to FIG. 2E or 2F.
Figure 2H:
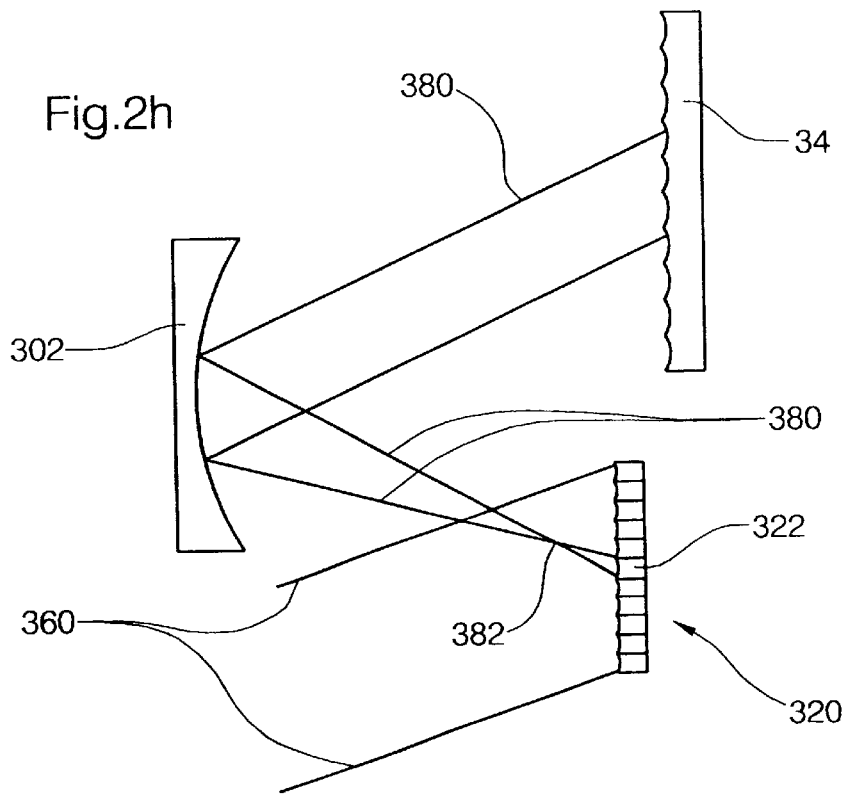

The functioning of mirrors 310 and 320 with raster elements will be explained in detail on the basis of FIG. 2G and FIG. 2H. FIG. 2G and FIG. 2H each show a portion of the illumination system of FIG. 2E and FIG. 2F, wherein the same reference numbers are used as in these figures. In FIG. 2G, beam bundle 360 impinges on mirror 310 with raster elements 312 and completely illuminates the mirror with raster elements. Raster elements 312 are concave in the embodiment of FIG. 2G. Each raster element produces one image of light source 1, and thus, a secondary light source, for example, at the site of focal point 372. After this focal point, the beam bundle again diverges in the direction of condenser mirror 302. Condenser mirror 302 images raster elements 312 on mirror 34 with field raster elements and superimposes the individual images of raster elements 312. By this, each individual raster element 312 is imaged onto the total illuminated surface of mirror 34 with field raster elements. The form of the illumination on mirror 34 with field raster elements corresponds to the external form of raster elements 312.

In FIG. 2H, mirror 310 with raster elements 312 was exchanged by mirror 320 with raster elements 322. While the focal length of raster elements 312 and 322 is identical, the size of the raster elements was reduced. Therefore, mirror 320 has more raster elements than mirror 310. Due to the smaller size, the illuminated surface on mirror 34 with field raster elements is also smaller.

Raster elements 312 and 322 may also be convex. Then, virtual secondary light sources 372 and 382 result. In addition to raster elements with concave or convex surfaces, diffractive raster elements may also be used. The individual raster elements 312 and 322 as well as also condenser mirror 302 for correcting the decentering error may have an anamorphotic effect, e.g., in the form of toric surfaces, based on the arrangement in a zigzag beam path.

Since raster elements 312 and 322 already produce secondary light sources, the secondary light sources produced by the field raster elements of mirror 34 are, strictly speaking, tertiary light sources. Depending on the number of illuminated raster elements 312 and 322, the secondary light sources produced without mirrors 31 and 32 are split into the same number of tertiary light sources. However, even in the case of tertiary light sources, these are denoted in the following text as secondary light sources, since they represent images of the light source.

Raster elements 312 and 322 of mirrors 310 and 320 may also be arranged individually tilted on mirrors 310 and 320. This is necessary if the impinging beam bundle 360 does not strike mirrors 310 and 320 as a parallel beam bundle. If the front focal point of condenser mirror 302 is found at the site of secondary light sources 372, then beam bundle 370 strikes mirror 34 with field raster elements as a parallel beam bundle. If the rear focal point of condenser mirror 302 is found at the site of mirror 34 with raster elements, then the images of raster elements 312 will be correctly superimposed.

Beam bundle 370 need not impinge on mirror 34 with field raster elements as a parallel beam bundle. The optical effect of condenser mirror 302 can be designed such that beam bundle 370 convergently impinges on mirror 34 with field raster elements. By this it can be achieved that the images of the field raster elements in reticle plane 39 are superimposed without the use of a condenser lens between mirror 34 with field raster elements and reticle plane 39. Alternatively, it is also possible that the individual field raster elements are arranged individually tilted.

Figure 2I:
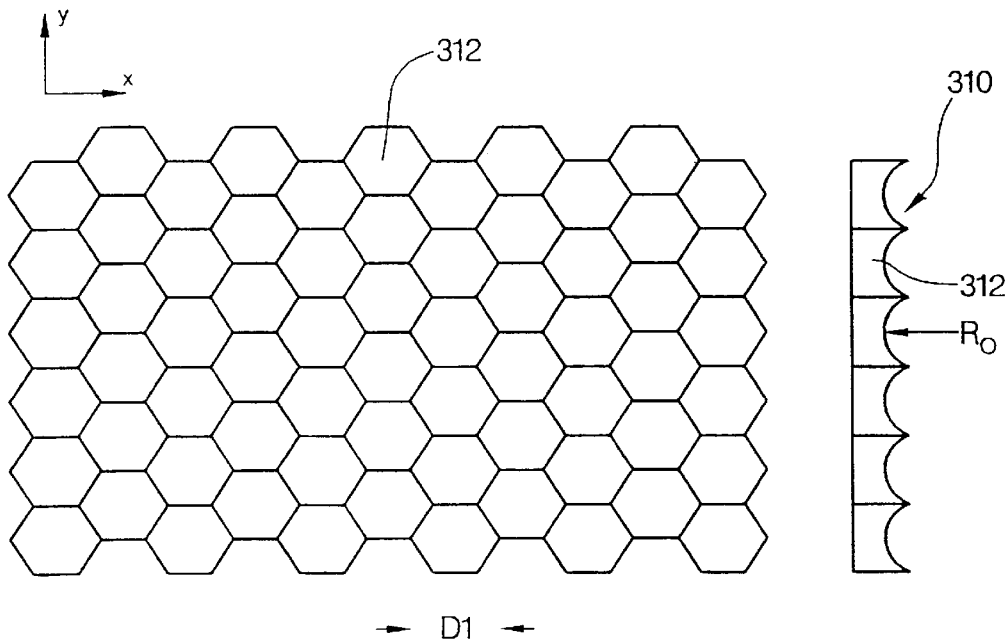
FIG. 2I and FIG. 2K show the front views of the second mirror with raster elements according to FIGS. 2E and 2F.
Figure 2K:
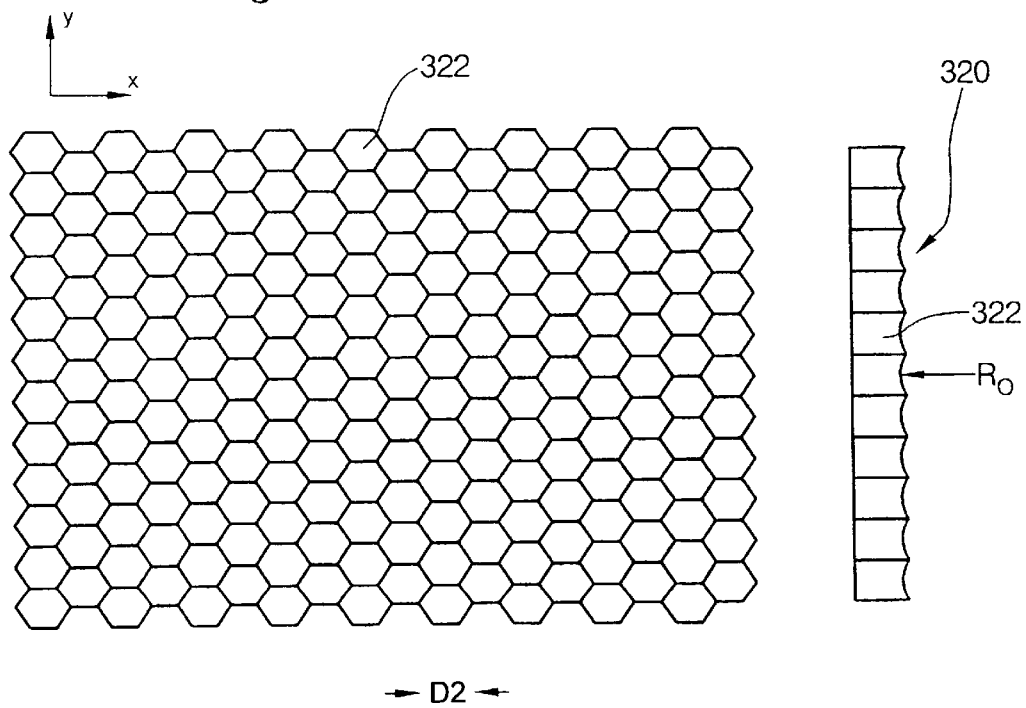

Mirrors 310 and 320 with raster elements 312 and 322 are shown in front and side view in FIG. 2I and FIG. 2K. The external form of mirrors 310 and 320 is adapted to the illumination with beam bundle 360. The external form of raster elements 312 and 322 is selected as a hexagon. Raster elements 312 and 322 have the same radius of curvature $R_0$ and thus the same focal length. The extent or dimension D2 of the external form of raster elements 322, however, is smaller than the dimension D1 of the external form of raster elements 312. Since the external form of individual raster elements 312 and 322 determines the illumination on mirror 34 with field raster elements, mirror 34 is also illuminated hexagonally, but the illumination is of different size depending on the dimension of D1 and D2 of raster elements 312 and 322. The hexagon shape was selected, on the one hand, in order to pack raster elements 312 and 322 as densely as possible and, on the other hand, to make the illumination of mirror 34 with field raster elements as round as possible. For a round illumination, round raster elements 312 and 322 would be ideal, but these cannot be packed without gaps. The illumination of mirror 34 with raster elements is also transferred to the illumination of exit pupil 390. The illumination of the exit pupil, however, is no longer continuous, but is discrete, based on the facetting of mirror 34 with field raster elements. The external form of the illumination, however, remains hexagonal. The hexagonal external form of illumination can be cut down to a round shape by a masking device in the diaphragm plane.

Figure 2M:
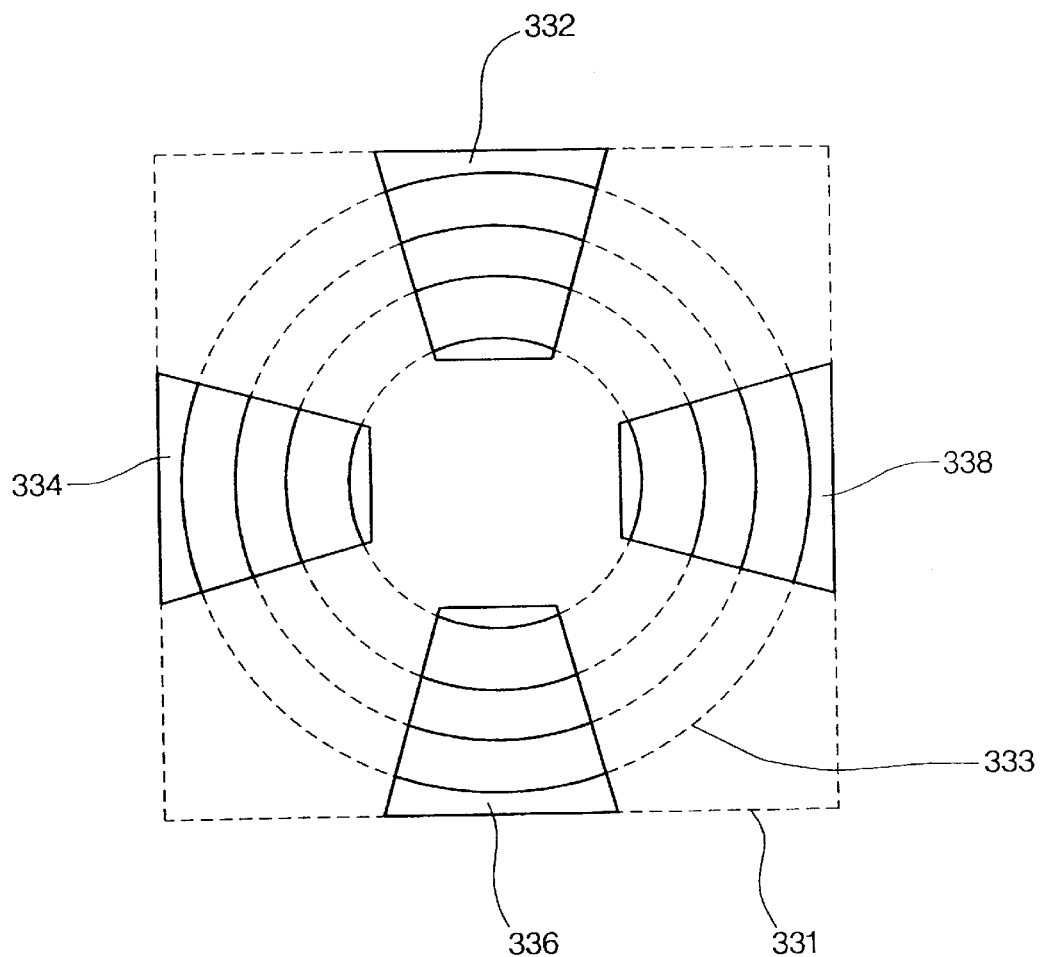
FIGS. 2M and 2N show possible embodiments of a mirror for producing a quadrupolar illumination.
Figure 2N:
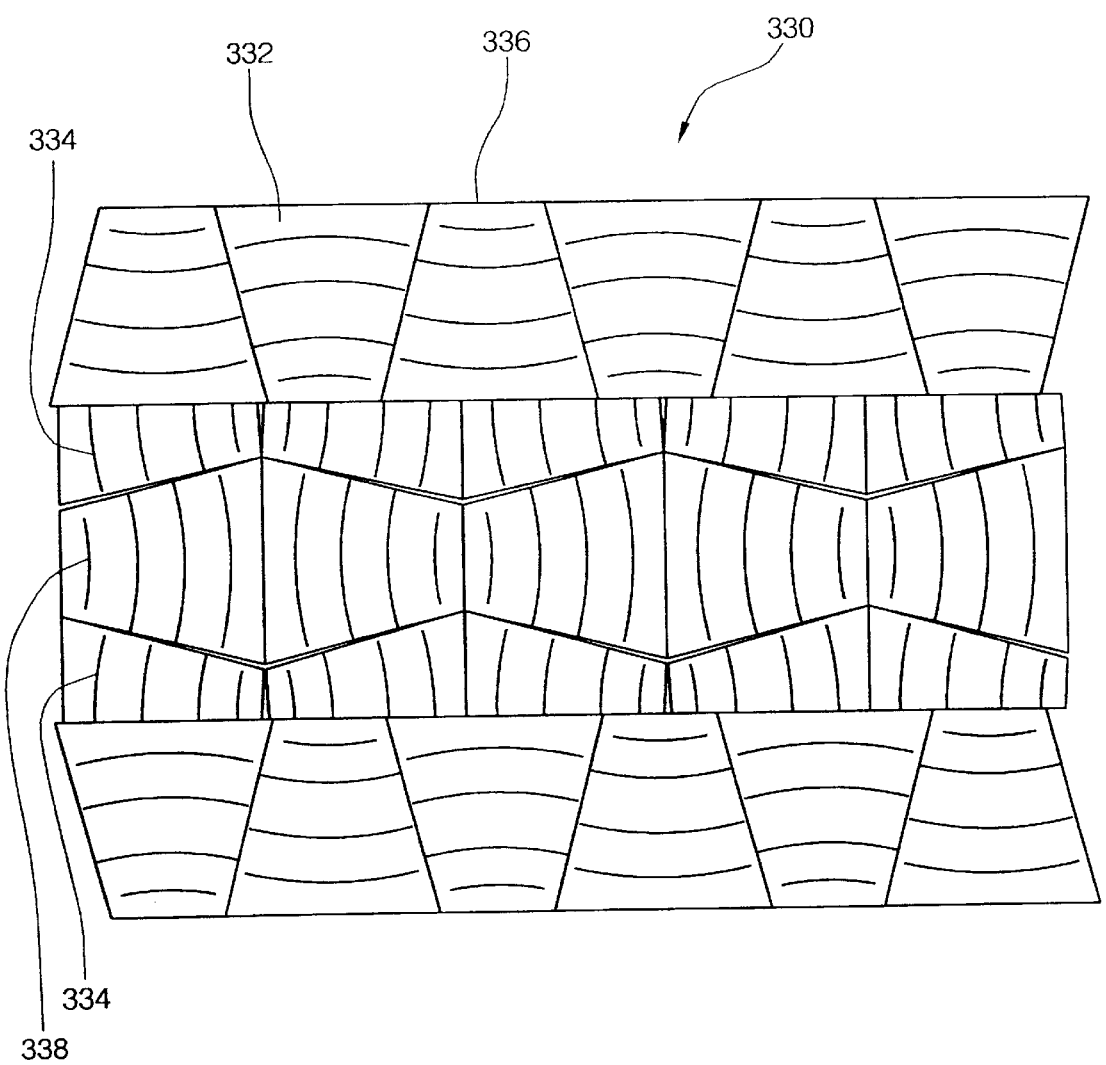

Depending on the pattern on reticle 39, the illumination of the exit pupil can be adapted by changing mirror 310 with raster elements. In addition to a nearly round illumination of variable size, it is favorable for special reticle patterns to illuminate the reticle from 4 different directions. This so-called quadrupolar illumination leads to 4 regions illuminated separately from one another in exit pupil 390, wherein the illuminated regions are illuminated discretely based on the facetting of mirror 34 with field raster elements. A quadrupolar illumination can be achieved with a mirror 330 with raster elements 332, 334, 336 and 338, as is shown in FIG. 2M and FIG. 2N. The functioning of mirror 330 is explained on the basis of FIG. 2M. FIG. 2M shows four individual raster elements 332, 334, 336 and 338, each of which contains off-axis segments of a concave or convex surface. A raster element with a square boundary line 331 and with a rotation-symmetric optical effect, which is shown as dotted lines 333, would illuminate mirror 34 with field raster elements in a square pattern. If one uses of these square raster elements, only the four off-axis trapezoidal segments 332, 334, 336 and 338, then mirror 34 with field raster elements is illuminated with four trapezoids. The trapezoid-form raster elements 332, 334, 336 and 338 may be arranged randomly on mirror 330. The trapezoidal form is used, since the raster elements can be densely packed on mirror 330, as is shown in FIG. 2N. Therefore, it is necessary to divide raster elements of forms 334 and 338 along a straight line lying between the oblique sides and to combine these divided raster elements together with the undivided raster elements. Of course, rectangular raster elements are also possible, in addition to the trapezoidal raster elements.

Due to the arrangement in a zigzag beam path, it may also be favorable for reducing the decentering error, in addition to an anamorphotic effect of the raster elements, to also distort their external shape. If an x-y coordinate system is placed in the plane of mirrors 310, 320 and 330 with raster elements, and if mirrors 310, 320 and 330 are tilted around the x-axis, then the external shape of the raster elements in the y-direction must be stretched or extended and the radius of curvature of the raster elements in the x-direction must be smaller in magnitude than in the y-direction.

Figure 2O:
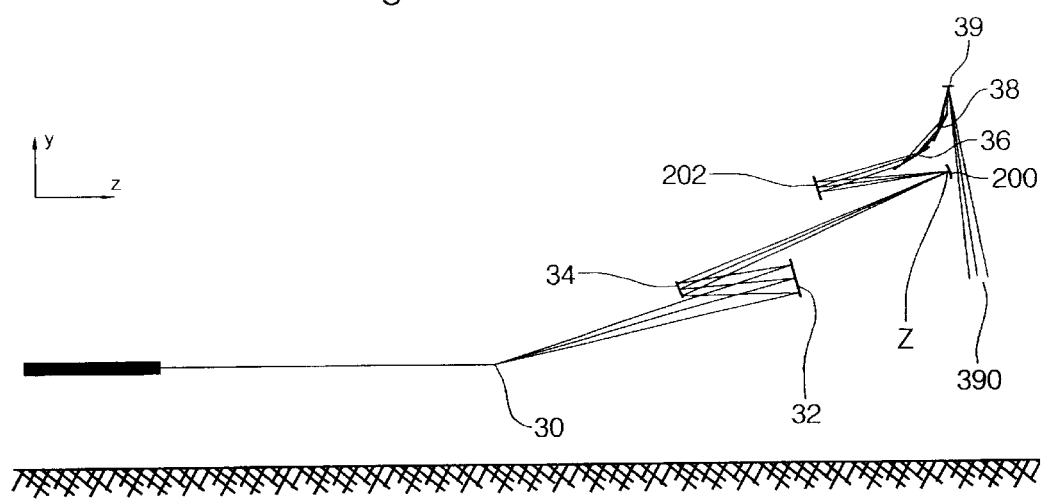
FIG. 2O shows an illumination system with intermediate image, wherein the deformable mirror is arranged in the plane conjugated to the reticle plane.

An illumination system with intermediate image Z is shown in FIG. 2o. Intermediate image Z is situated in a plane conjugated to the object plane or to the reticle plane. The same components as in FIGS. 2C and 2D are given the same reference numbers. In such a system, in order to vary the distribution of illumination in the exit pupil of the illumination system, an additional mirror 200 can be placed in this intermediate image Z or defocused relative to the intermediate image Z.

Since the reticle plane in this system is situated conjugated to the additional mirror 200, the angular distribution in the reticle plane can be influenced by mirror 200, whereas the field distribution remains nearly uninfluenced.

In order to influence the intensity distribution in the exit pupil, in systems with intermediate image Z, the additional mirror 200 is provided after mirror 34 with field raster elements or after the mirror with pupil raster elements at the site of the temporary intermediate image Z. The site of mirror 200 is found in the plane in which the images of field raster elements 34 of the mirror with raster elements are superimposed. One or two additional mirrors 202, which image the intermediate image Z in the reticle plane follow after this additional mirror 200. In the example shown, a normal-incidence mirror 202 is provided for this.

The field mirrors 36, 38 following the additional mirror 202, have the task of forming the ring field, imaging the exit pupil of the illumination system in the entrance pupil of the downstream objective, and controlling the illumination distribution.

Figure 2P:
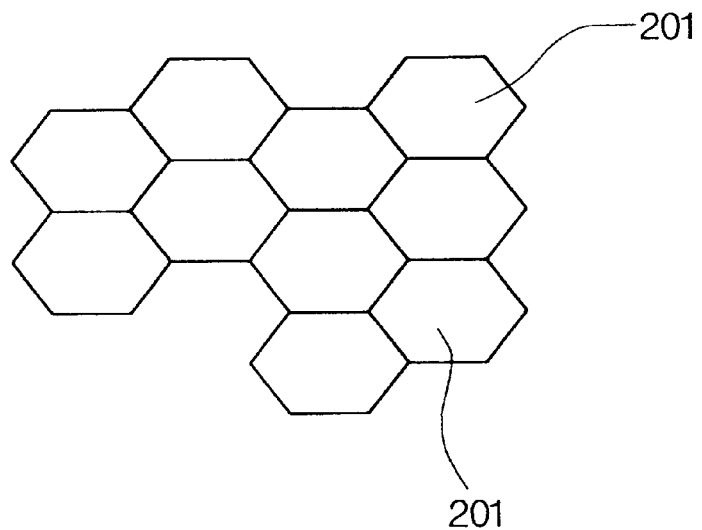
FIG. 2P shows a section of the additional mirror with a number of field raster elements arranged on the mirror surface.
Figure 2Q:
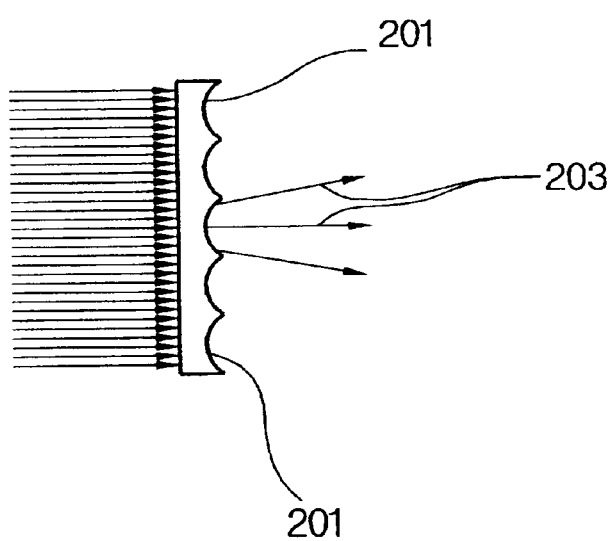
FIG. 2Q shows a side view of the additional mirror with field raster elements.

The additional mirror 200 may be designed, for example, as an additional mirror with raster elements in addition to the mirror with field raster elements 34. The raster elements of the additional mirror are configured as convergent or divergent mirrors or appropriate diffractive elements. The individual raster elements 201 may be arranged, for example, as hexagons, in a dense packing. Such an arrangement is shown in FIG. 2P. An incident light bundle is converted by the multiple number of individual raster elements so that a light bundle 203 of defined aperture exits from each individual raster element 201, as shown in FIG. 2Q. The dimensions of the individual raster elements must be selected as small as possible, in order to be able to fulfill the uniformity requirements in the reticle plane. A typical dimension of the raster elements is 10 μm. In order not to see the discrete form of the individual raster elements in the intensity distribution of the reticle plane, it is possible, for example, to arrange the additional mirror with raster elements defocused relative to the intermediate image. The illumination of the exit pupil of the illumination system can be varied each time, depending on the effect of the individual raster elements. The filling degree can be varied, for example, between a σ=0.2 and σ=1.0 by changing the element.

The arrangements of raster elements shown in FIG. 2I, FIG. 2K and FIG. 2N may also be used in the case of the additional mirror 200 with raster elements. The focal lengths of the individual raster elements must then be adapted correspondingly.

Alternatively, additional mirror 200 may be designed as a deformable mirror.

In general, two types of deformation of a mirror surface can be distinguished in a plane conjugated to the reticle plane:
(1) Statistical deformations with small spatial frequencies, which lead to a modification of the chief-ray angular distribution in the reticle plane. This effect may be drawn on, for example, for correcting telecentry.
(2) Dynamic deformations with very large spatial frequencies, which lead to a variation of the aperture distribution around the chief ray, which is constant, on average, and thus lead to the desired influence of the illumination of the exit pupil of the illumination system. Such dynamic deformations for controlling the illumination distribution must be very rapid in comparison to the exposure time or the scanning speed.

Dynamic deformations with very large spatial frequencies can be used, for example, in order to homogenize the illumination distribution in the exit pupil of the illumination system. As can be seen in FIGS. 7 to 13, non-illuminated regions are found between the images of the secondary light sources in the exit pupil. By oscillating the surface of the additional deformable mirror 200, the regions not illuminated in the static case can also be illuminated, when considered over a time average.

Figure 3:
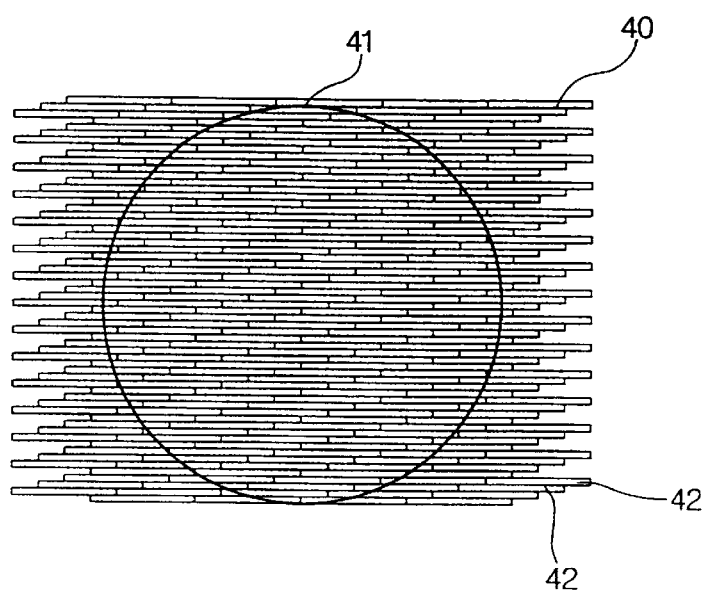
FIG. 3 shows an example of a mirror with raster elements arranged thereon.

For the uniform distribution of the secondary light sources in the diaphragm plane, the facet rows 40 with the individual raster elements are arranged displaced relative to one another on mirror 34, as shown in FIG. 3. Circle 41 in FIG. 3 shows the illumination of the mirror with raster elements by EUV source 1. The aspect ratio of raster elements 42 in the case shown amounts to 17.5:1.

Raster elements 42, which are denoted below also as field raster elements, produce secondary light sources in the diaphragm plane of the illumination system, and the distribution of these sources is defined by the distribution of the raster elements on the mirror.

Figure 4A:
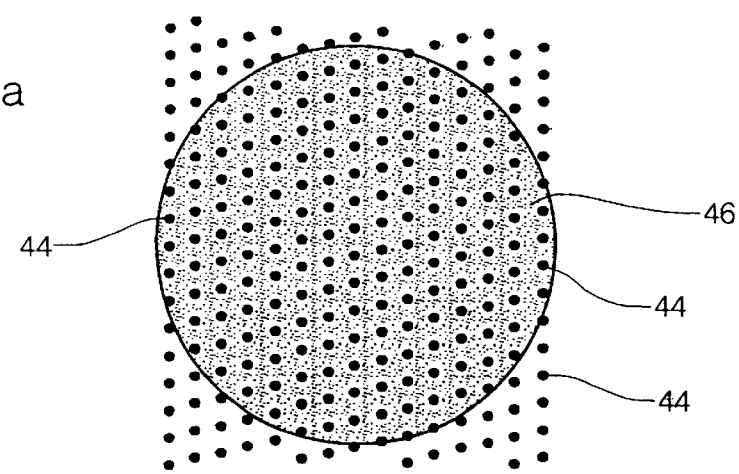
FIG. 4A shows the distribution of the secondary light source in the diaphragm plane for a mirror according to FIG. 3.

The distribution of secondary light sources 44, which results in the diaphragm plane, is shown in FIG. 4A, with the use of a mirror with raster elements according to FIG. 3.

The shaded surface 46 in the diaphragm plane indicates the maximal diaphragm illumination, which can be taken up by an objective arranged downstream to the illumination system. The entrance pupil of this objective coincides in the present case with the exit pupil of the illumination system.

Typically, the aperture of an EUV illumination system on the wafer side amounts to $NA_{wafer}=0.1$. For an objective reduction ratio of β=−0.25 in the reticle plane, this corresponds to an aperture of $NA_{reticle}=0.025$ or, in the system presently considered with a diameter of 64 mm on the mirror with field raster elements.

Another EUV illumination system will be described below as an example.

The wiggler source that is the basis for the design described below has an aperture of 33 mrad in the horizontal direction and an aperture of 2 mrad in the vertical direction. The length of the source amounts to 2 m.

The illumination system for this wiggler source is a double facetted system, i.e., a system with two mirrors with raster elements. The double faceted system collects the source radiation with a high aspect ratio and fills the round pupil. Such a system, in principle, is shown schematically in FIG. 4D. The reference numbers used below refer thereto.

The radiation is collected by a grazing-incidence collector mirror 30 and converted into a nearly parallel beam bundle. Field raster element plate 34 and pupil raster element plate 37 following the collector mirror in the light path are normal-incidence mirrors. The field raster elements are distributed so that they cover, optimally, the illuminated rectangular area. Each field raster element is then assigned to a pupil raster element. The pupil raster elements are arranged in a radial grid in the diaphragm plane of the illumination system. The arrangement of pupil raster elements is corrected so that aberrations of field lenses 36, 38 are corrected. By tilting the field and pupil raster elements, the images of the field raster elements are superimposed in the object plane or reticle plane 39. The illumination system is adapted to a downstream projection objective with the two grazing-incidence field mirrors 36, 38.

Field raster element plate 34 and pupil raster element plate 37 in this system comprise collecting or converging raster elements, which are tilted individually. The field raster elements also have a high aspect ratio.

The illumination system is designed for the following field in the reticle plane:
(1) 60° segment with r=104 mm and Δr=±4.0 mm →x-y aspect ratio of 108.9 mm/8 mm=13.6/1.
(2) Aperture in the reticle plane $NA_{ret}=0.05$.
(3) Structural length L between pupil raster element plate and reticle: L=1000 mm
(4) The number of field raster elements was selected so that the requirements for uniformity of scanning energy can be fulfilled.

Collector mirror 30 is designed so that it illuminates field raster element plate 34 of dimensions A=160 mm×40 mm. The illumination of the field raster element plate is annular due to the effect of the grazing-incidence collector mirror 30. Therefore, not all field raster elements on the field raster element plate are illuminated.

The form of the field raster elements is selected as a rectangle. Thus the aspect ratio of the field raster elements corresponds to the ratio of the arc length to the width of the ring in the reticle plane. With a raster element size of 20 mm×1.2 mm, 120 field raster elements are illuminated, so that a sufficient homogeneity of the scanning energy results. The collecting effect of each field raster element is designed so that it produces a secondary light source in the diaphragm plane.

At the site of the secondary light sources, the pupil raster elements, which image the field raster elements in the reticle plane, are arranged on pupil raster element plate 37. The arrangement of pupil raster elements in the diaphragm plane is selected independently of the grid pattern of the field raster elements. They are arranged in such a way that they produce a predetermined distribution in the exit pupil of the illumination system. For example, the pupil raster elements can be arranged on a radial grid. In order to correct for pupil aberrations of the field lenses 36, 38, they may also be arranged on a deformed grid.

Each field raster element is assigned to a pupil raster element. The assignment of field raster element and pupil raster element can be made from various viewpoints. One possibility is to assign spatially adjacent raster elements each time. In this way, the deflection angles are minimal. Another possibility is to homogenize the intensity distribution in the pupil plane. This approach may be used when the intensity distribution has a progression in the plane of the field raster elements. If the field and pupil raster elements have similar positions, the progression is transferred to the pupil illumination. By intermixing of the assignments in this case, the intensity can be equilibrated. The beam bundles will be deflected by tilting the field and pupil raster elements so that the images of the field raster elements are superimposed in the reticle plane.

A rectangular field is illuminated in the reticle plane without field lenses 36, 38. The illuminated ring segment in the reticle plane is formed by the grazing-incidence field mirrors. They also image the diaphragm plane of the illumination system in the entrance pupil of the objective and can control the course of the scanning energy.

In order to control the illumination of the exit pupil of the illumination system, particularly selected field or pupil raster elements can be masked or not illuminated. It is also possible to arrange the pupil raster elements in such a way that a predetermined illumination results in the exit pupil. For example, a ring is illuminated in the exit pupil due to the arrangement of pupil raster elements. By controlling the illumination of the mirror with field raster elements or by masking the mirror with pupil raster elements, a change from ring to quadrupolar illumination can be achieved An EUV illumination system with wiggler source is shown in FIGS. 4B–4M. The same components as in FIGS. 1–4A are given the same reference numbers.

Figure 4B:
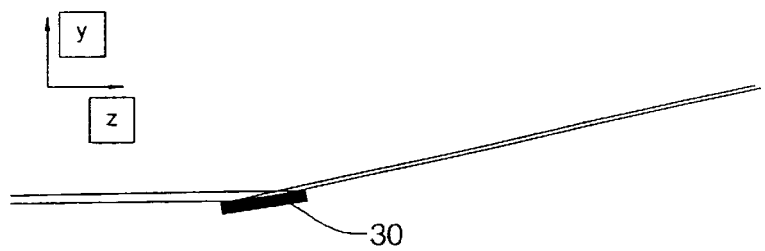
FIGS. 4B–4I and 4K–4M show an embodiment of an EUV illumination system with a wiggler source.

FIG. 4B shows a schematic diagram of collector mirror 30 in y-z section. The source is arranged at a distance of 1700 mm in front of the collector mirror.

Figure 4C:
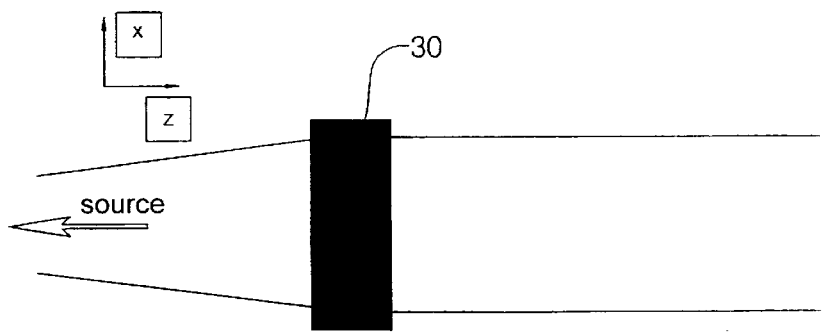

FIG. 4C shows a schematic diagram of collector mirror 30 in x-z section.

Figure 4D:
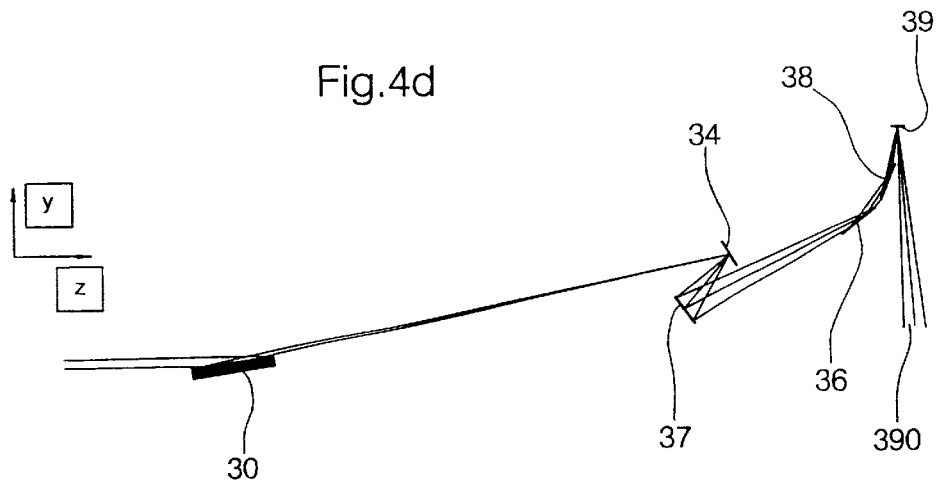

FIG. 4D shows the illumination system in y-z section. The source is not depicted and is arranged at a distance of 1700 mm in front of collector mirror 30.

The following is shown in FIG. 4D: the collector mirror 30; the first mirror with raster elements, which is also denoted as the field raster element plate 34; the second mirror with raster elements, which is also denoted as pupil raster element plate 37; field lenses 36, 38; and reticle plane 39.

Figure 4E:
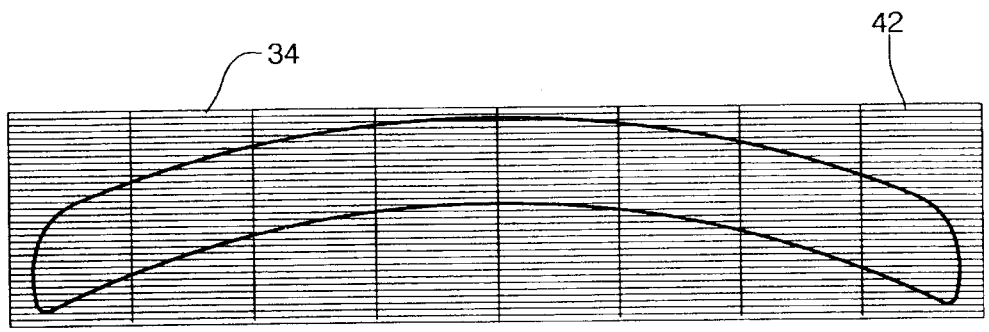

FIG. 4E shows a schematic diagram of field raster element plate 34. The arc-shaped shaped illumination is also depicted. For clarity of the representation, all raster elements or raster elements 42 are aligned in the x-y direction. In the real system, raster elements 42 are rotated around their x-axis and y-axis by their own z-axis by tilting.

Figure 4F:
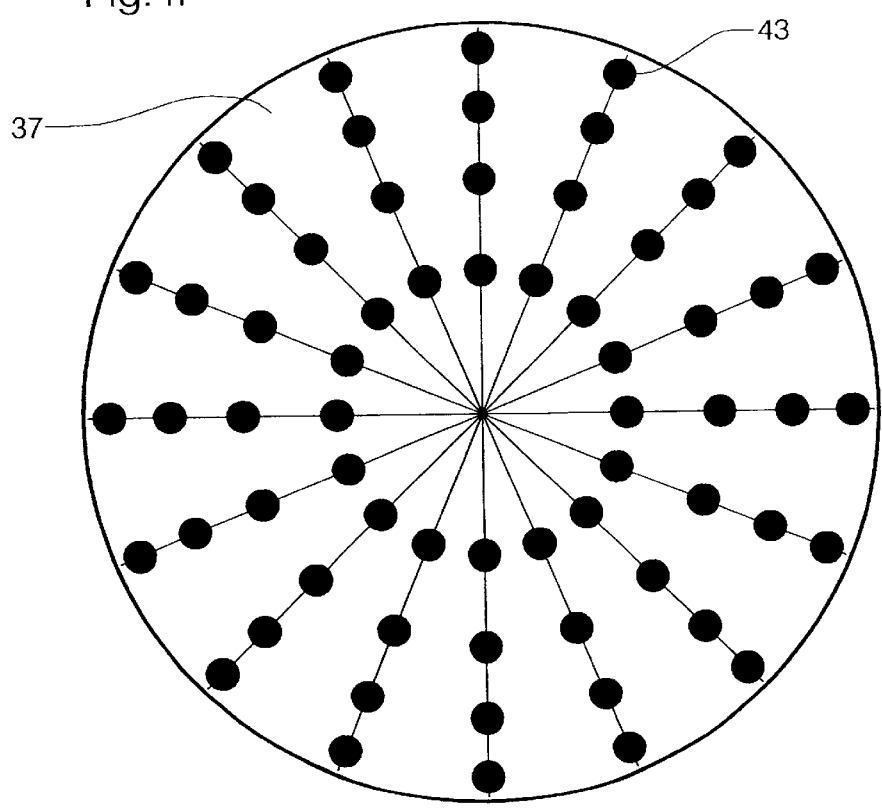

FIG. 4F shows a schematic representation of pupil raster element plate 37. Pupil raster elements 43 are arranged on spokes.

Figure 4G:
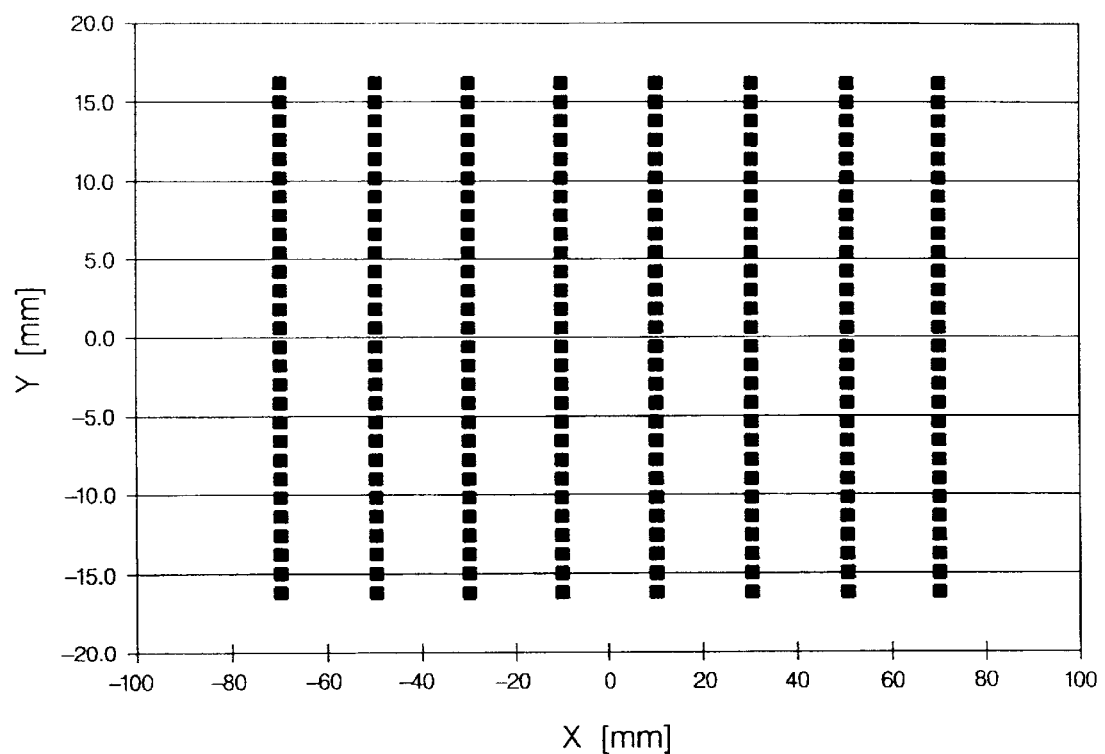

The space points of field raster elements 42, as they are arranged in the example of embodiment, are shown in FIG. 4G.

Figure 4H:
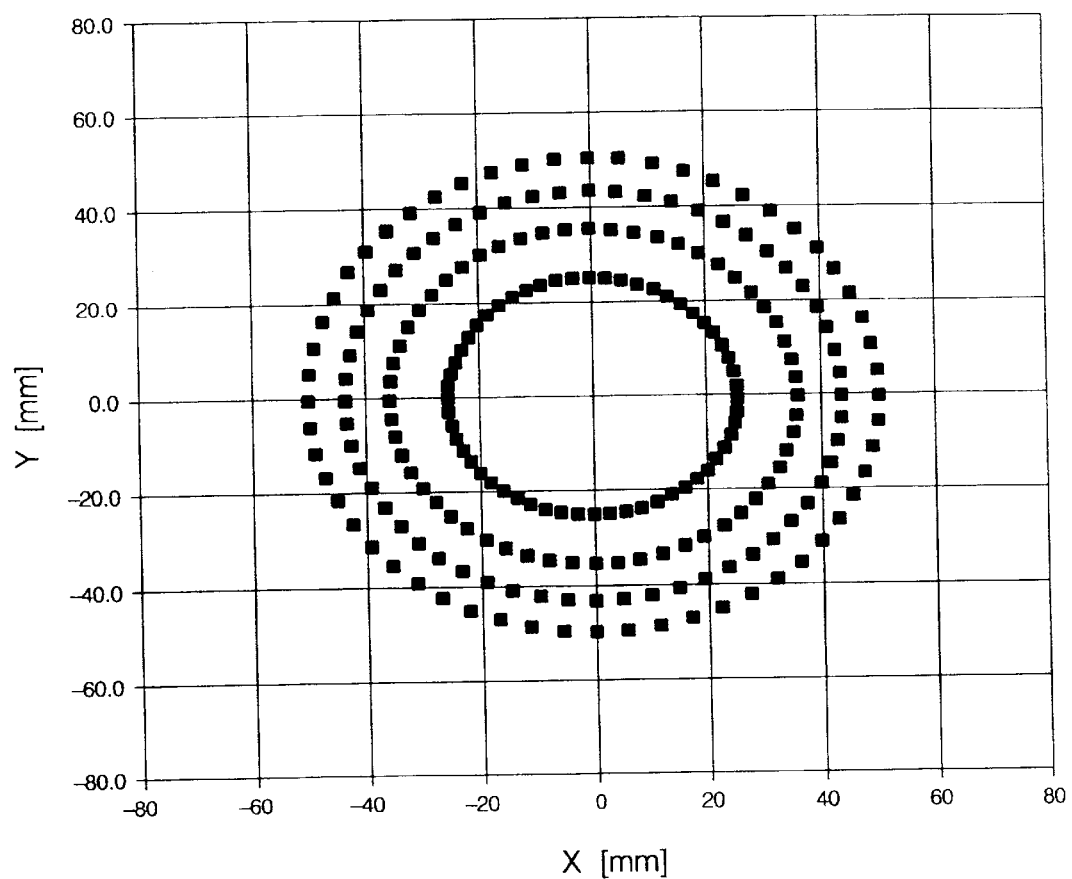
Figure 4I:
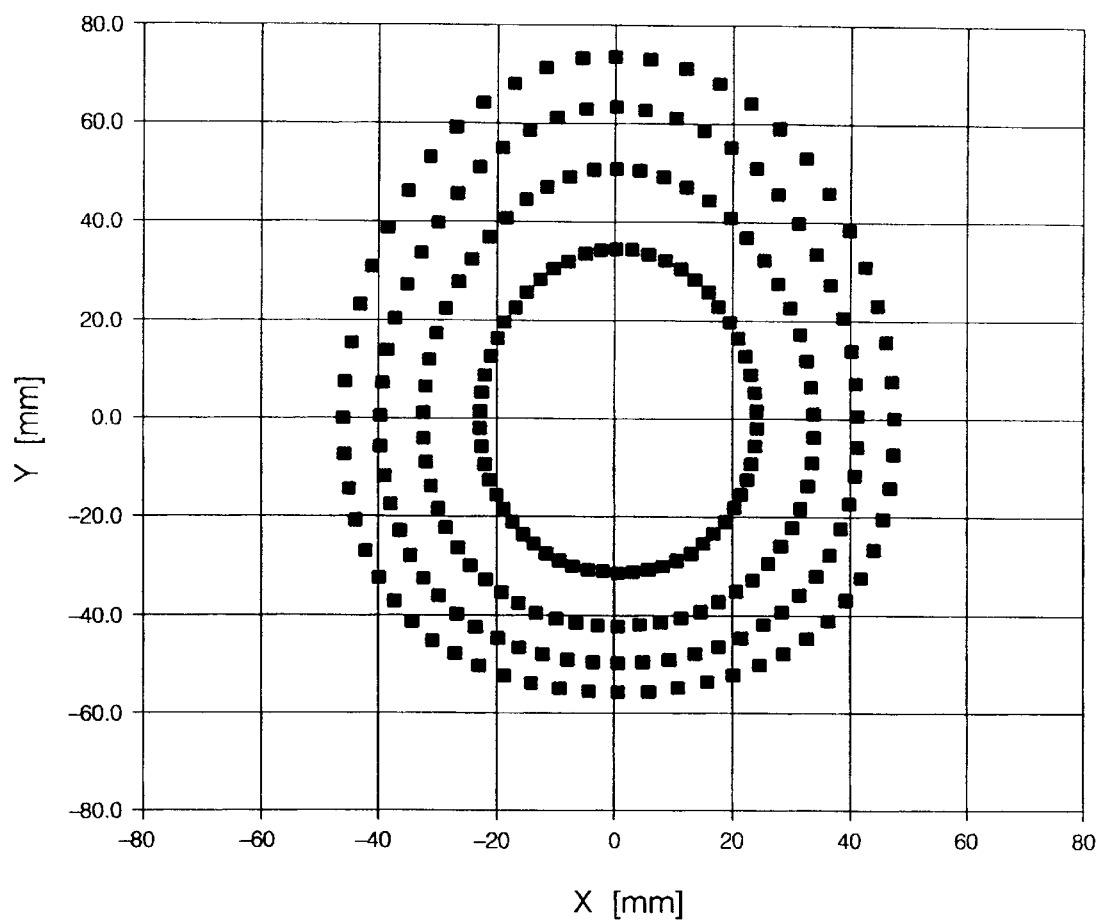

FIG. 4H shows the space-points of pupil raster elements 43, as they would be produced without field lenses 36, 38 and FIG. 4i shows the space-points of pupil raster elements 43, as they result with field lenses 36, 38. The deformed arrangement of pupil raster elements 43 compensates for the pupil aberrations of field lenses 36, 38.

Figure 4K:
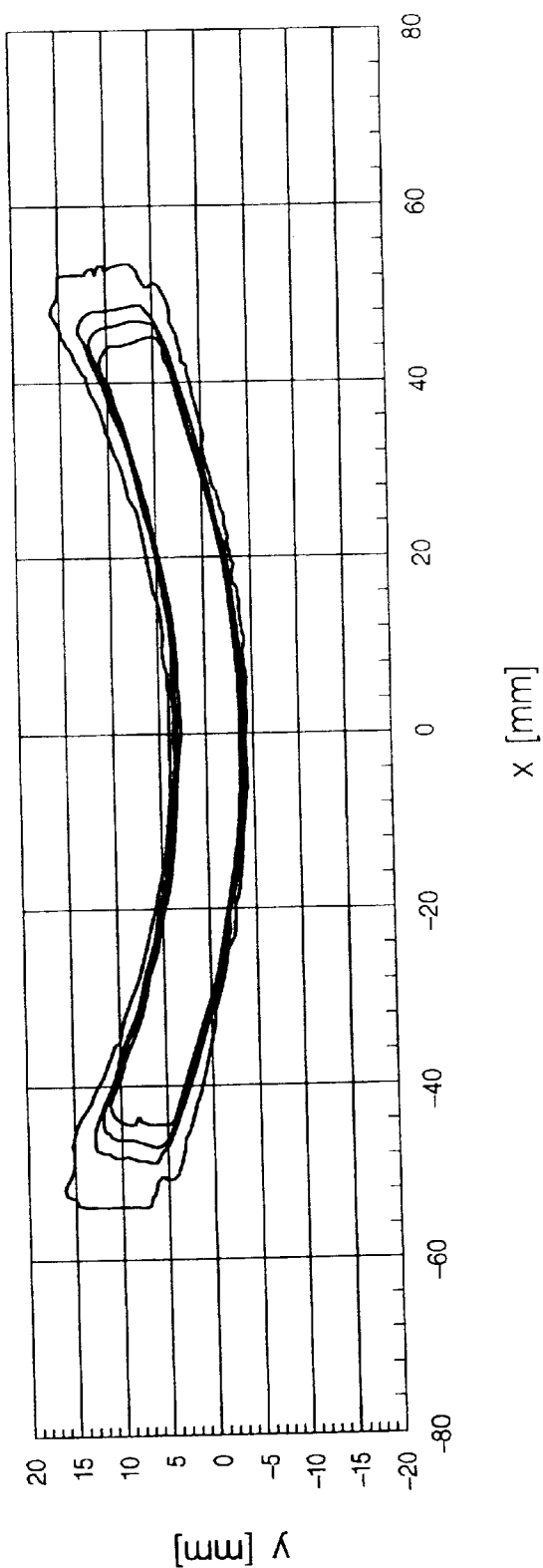

FIG. 4K shows the illumination of reticle plane 39 with the ring field for the system shown in FIGS. 4B–4i.

Figure 4L:
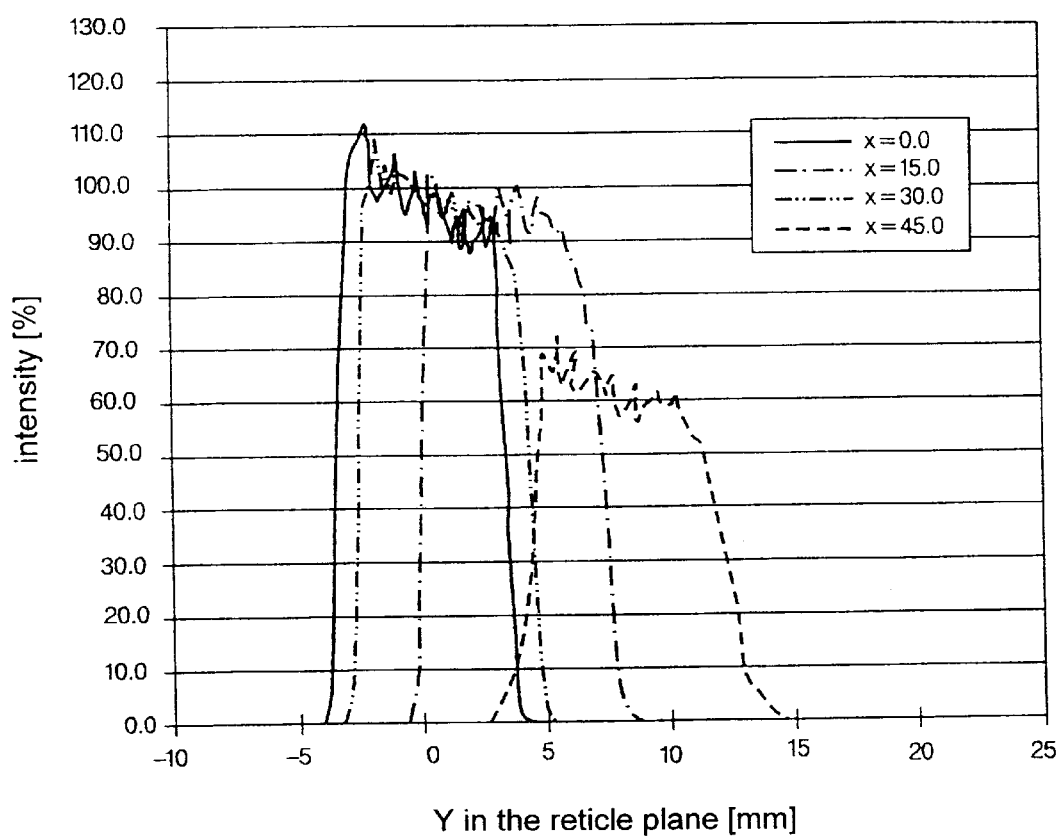

Cross sections of the intensity in the reticle plane 39 are shown in FIG. 4L for x=0.0 mm, 15.0 mm, 30.0 mm, and 45.0 mm.

Figure 4M:
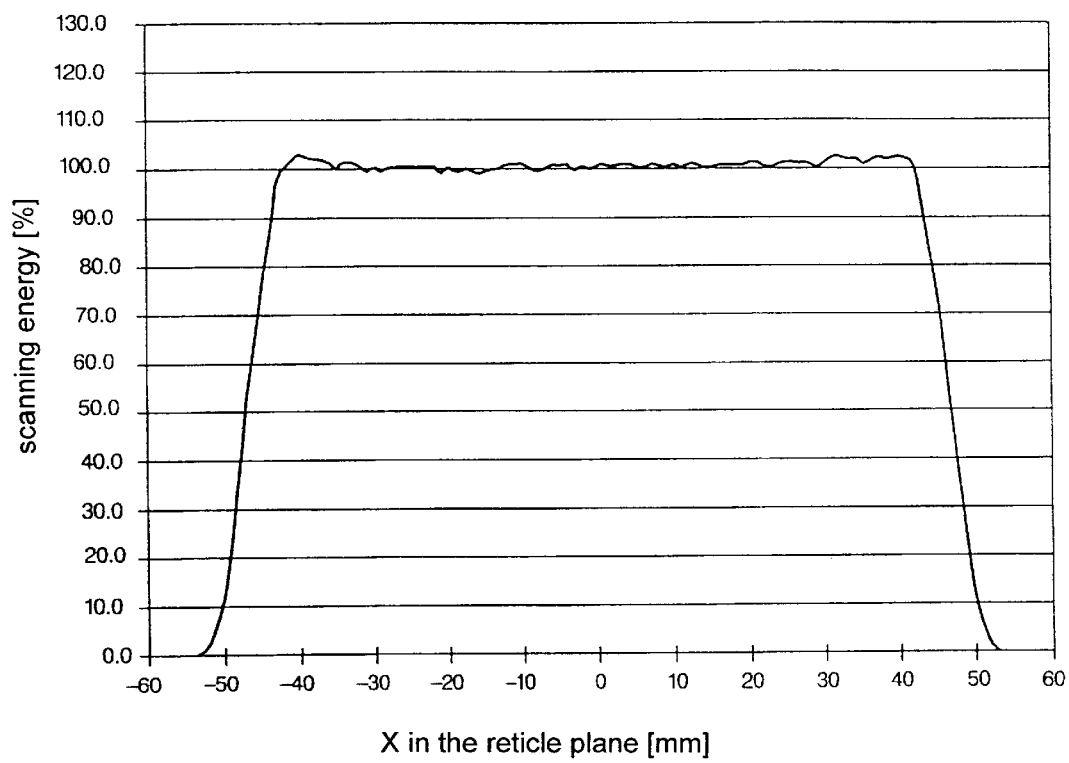

FIG. 4M shows the course of the scanning energy, which results as an integral over the intensity distribution along the scanning path.

The light distribution or the illumination setting in the exit pupil, which coincides presently with the entrance pupil of the projection objective, is defined for circular illumination by the filling factor σ. The following is valid:

$$\text{Filling factor:} \sigma = \frac{r_{lighting}}{R_{objective aperture}}$$

Figure 5:
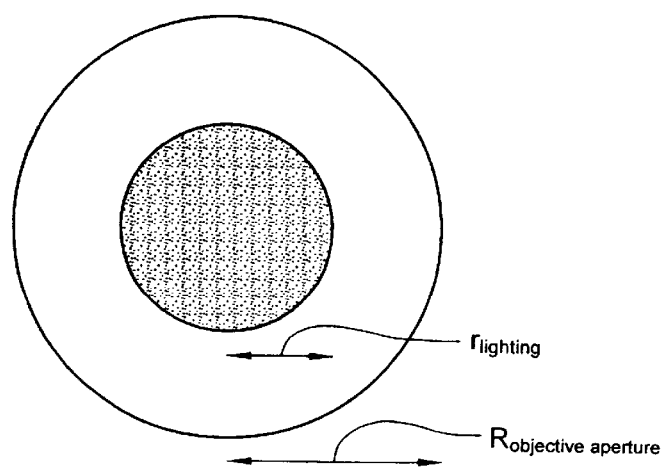
FIG. 5 shows the relationship between the objective aperture and illumination for defining the filling factor.

The parameters $r_{illumination}$ and $R_{objective\ aperture}$ can be taken from FIG. 5. The parameter $R_{objective\ aperture}$ gives the diameter of the entrance pupil for the maximum objective aperture. The parameter $r_{illumination}$ indicates the diameter of the circular illumination of the entrance pupil. In the case of hexagonal or non-continuous illumination of the entrance pupil, $r_{illumination}$ may also be determined by means of a radial integration over the entire illuminated surface in the entrance pupil. Then the filling degree σ corresponds to the coherence factor $\sigma_{out}$ which is defined below for the case of annular illumination.

By definition, the entrance pupil of the projection objective is completely filled for σ=1.0; and, for example, σ=0.6 corresponds to an underfilling.

In the case of an annular light distribution, the entrance pupil of the projection objective is illuminated in the shape of a ring. The following definition of $\sigma_{out}/\sigma_{in}$ can be used to describe it.

$$\sigma_{out} = \frac{r(90)}{R(NA_{max})} \quad \text{wherein} \quad \int_0^{r(90)} I(r)rdr = 0.9 \cdot \int_0^{R(NA_{max})} I(r)rdr$$

$$\sigma_{in} = \frac{r(10)}{R(NA_{max})} \quad \text{wherein} \quad \int_0^{r(10)} I(r)rdr = 0.1 \cdot \int_0^{R(NA_{max})} I(r)rdr$$

wherein:

| | |
|---|---|
| I (r) = I (x, y): | intensity distribution in the entrance pupil of the projection objective; |
| x, y: | x, y coordinates in the entrance pupil of the projection objective; |
| r: | radial coordinate in the entrance pupil of the projection objective; |
| $NA_{max}$: | maximum objective aperture; |
| R ($NA_{max}$): | radial margin or edge of the entrance pupil with maximum objective aperture; |

-continued

| r (90): | radius of a circle within which 90% of the total intensity occurs; |
|---|---|
| r (10): | radius of a circle within which 10% of the total intensity occurs; |
| $\sigma_{out}$, $\sigma_{in}$: | coherence factor. |

Another light distribution investigated below is the so-called quadrupolar illumination for imaging of "Manhattan" structures, for example.

As FIGS. 6A to 6D show, the number of secondary light sources 44 and thus the diaphragm illumination can be varied by illumination 41 of the field raster element plate. FIGS. 6A to 6D show the illumination of the field raster element plate with raster elements 40 and the distribution of the secondary light sources 44 belonging thereto in exit pupil 49 of the illumination system, which is also the entrance pupil of the downstream objective. The same components as in FIGS. 3–5 are given the same reference numbers in FIGS. 6A–6D.

The illumination of the field raster element plate can be varied by means of a masking device arranged in front of the field raster element plate, a controllable scanning mirror, an exchangeable collector mirror, a deformable collector mirror or an exchangeable additional mirror with raster elements.

FIG. 6A shows the illumination for a filling degree of $\sigma$=1.0. FIG. 6B shows a circular illumination with a filling degree of $\sigma$=0.6. FIG. 6C shows an annular or ring-shaped setting with $$\frac{\sigma_{out}}{\sigma_{in}} = \frac{1.0}{0.7}$$

A quadrupolar illumination of the field raster element plate is shown in FIG. 6D.

The results of simulation calculations for the different illumination distributions shown in FIGS. 6A–6D are shown in FIGS. 7 to 18.

The following settings or distributions are described, for example:
1. Circular setting with $\sigma$=1.0
   Illumination of the field raster element plate with a radius of r=35.0 mm, which corresponds to an aperture of $NA_{ret}$=0.025.
2. Circular setting with radius $\sigma$=0.6
   Circular illumination of the field raster element plate with radius r=20.0 mm.
3. Annular setting with $$\frac{\sigma_{out}}{\sigma_{in}} = \frac{1.0}{0.7}$$

Ring-shaped illumination of the field raster element plate with radius $r_{out}$=35.0 mm and $r_{in}$=25 mm.
4. Quadrupole setting
   Four circular illuminations of the field raster element plate with r=10 mm on the diagonals and with a distance a=21.2 mm from the optical axis.

The resulting pupil illumination for the illumination of the field raster element plate according to settings 1–4 above is calculated for the axis point (x=0.0; y=0.0) and a field point at (x=40.0; y=4.041) at the edge and is shown in FIGS. 7–14.

For the case of a filling degree $\sigma$=1.0 (case 1), the pupil is filled uniformly up to the maximum aperture of $NA_{ret}$=0.025 with 213 secondary light sources. The pupil illumination for the field point in the center of the reticle plane x=0, y=0 is shown in FIG. 7.

As can be seen from FIG. 8 for the point at the edge of the field, x=40.0, y=4.041, the form of the pupil illumination also remains at the edge of the field. The pupil according to FIG. 8 is shifted overall, however, by the offset of the angle of the chief ray, wherein the optical axis of the illumination system in the reticle plane represents the reference system.

For a filling degree of $\sigma$=0.6 (case 2), the pupil is filled up to the aperture of $NA_{ret}$=0.6•0•0.025=0.015 with 72 secondary light sources. The pupil illumination for the field point in the center of the reticle plane (x=0, y=0) is shown in FIG. 9; the pupil illumination for the field point at the edge (x=40.0, y=4.041) is shown in FIG. 10.

For a ring-shaped setting (case 3) with $$\frac{\sigma_{out}}{\sigma_{in}} = \frac{1.0}{0.7}$$

the pupil between aperture $NA_{out}$=0.025 and $NA_{in}$=0.0175 is filled with 102 secondary light sources. The illumination for the field point in the center of the reticle plane (x=0, y=0) is shown in FIG. 11; the illumination for the point at the edge of the field (x=40.0, y=4.041) is shown in FIG. 12.

In the case of illumination of the raster element plate with quadrupolar illumination (case 4), the exit pupil in each of the four segments is filled with 18 secondary light sources. FIG. 13 shows the illumination for a point in the center of the field and FIG. 14 shows the illumination for a point at the edge of the field.

The evaluation of the uniformity of the scanning energy for the different illumination settings is shown in FIGS. 15 to 18. A dependence on the illumination of the raster element plate, i.e., the setting, can be seen.

For a filling degree of $\sigma$=1.0 with circular illumination, an ideal course of the scanning energy with a uniformity of less than 1% is shown, as can be seen from FIG. 15.

For a filling degree of $\sigma$=0.6 with circular illumination, a uniformity of 2% results due to the reduction in the number of field raster elements participating in the mixing process, as can be seen from FIG. 16. In the above-presented example for the filling degree of a $\sigma$=1.0, the number of field raster elements amounted to 213 field raster elements, while on the other hand for $\sigma$=0.6, only 72 field raster elements are illuminated and thus participate in the mixing process.

In the case of annular illumination, many field raster elements are only partially illuminated. The consequence of this is that when 102 field raster elements participate in the mixing process as opposed to 213 field raster elements for $\sigma$=1.0, the uniformity amounts to 3%, as is shown in FIG. 17. The greater uniformity in the case of annular illumination in comparison to circular illumination with $\sigma$=0.6, despite the participation of more field raster elements in the mixing process, can be attributed to the partial illumination of the field raster elements.

In the case of quadrupolar illumination, the scanning energy shows a characteristic "4-wave pattern" with a uniformity of 5%, as can be seen from FIG. 18. This is due to the fact that additional field raster elements can contribute to the illumination or can be omitted, each time depending on field point, for quadrupolar illumination, and almost all field raster elements are only partially illuminated.

As can be derived from the described simulation, the variable pupil illumination is limited by the required uniformity of the intensity distribution in the case of stepper systems or the uniformity of scanning energy in the case of scanner systems. In general, it is true that as fewer raster element images are superimposed in the reticle plane, the poorer the intermixing is and thus the poorer the uniformity of field illumination. If one would like to increase the uniformity for extreme pupil distributions, i.e., small σ with circular illumination or narrow ring with annular illumination or quadrupole, then the number of raster elements must be increased, which means a reduction of the raster element dimensions and an increase of the raster element reduction ratio with the same dimensions of the field raster element plate.

Due to the high aspect ratio of 17.5:1 of the raster elements in the present examples of embodiment, the raster elements at the edge of the illuminated surface are only partially illuminated. FIG. 19 shows a configuration in which only two field raster elements 100, 102 are illuminated in each x row. Each raster element 100, 102, which is illuminated, produces a secondary light source 104 in the diaphragm plane of the illumination system, as shown in FIG. 20. The distribution of secondary light sources 104 in the diaphragm plane in the case of circular illumination of the field raster element plate is consequently elliptical, since additional secondary light sources are added in the x-direction. The pupil illumination of each individual field point in the reticle plane, however, remains round, since not every field point receives light from each secondary light source. Descriptively stated, the pupil distribution for the edge of the field is right or left-loaded, as shown in FIG. 20.

With a specially shaped masking device, all incompletely illuminated field raster elements 102 can be covered. This masking device can be arranged directly in front of mirror 98 with field raster elements 102. The boundary line of the masking device is thus adapted to the external shape of field raster elements 102. Correspondingly adapted masking devices, which can be exchanged, for example, must be used for different illuminations of mirror 98 with field raster elements 102.

In order to reduce the aspect ratio, the individual raster elements can be shaped in such a way that they have an anamorphotic effect, as described, for example, in DE 199 31 848.4, filed on Jul. 9, 1999, for the applicant, the disclosure content of which is incorporated to the full extent in the present application.

Two field raster element plates 34 with the same number of field raster elements 42 are shown in FIGS. 21 and 22, wherein, however, the aspect ratio or the dimensions of field raster elements 42 is different. The aspect ratio of raster elements 42.1 in FIG. 21 amounts to 17.5:1; that of raster elements 42.2 in FIG. 22 amounts to 1:1. As can be seen from a comparison of FIG. 21 and FIG. 22, with the same amount of illumination 41 of the raster element plates in FIG. 21 and FIG. 22, in the case of square raster elements 42.2, more raster elements are completely illuminated than in the case of raster elements 42.1 with high aspect ratio. In this way, the uniformity of illumination in the case of square raster elements is better than in the case of a raster element plate with raster elements having a high aspect ratio. In the case of field raster elements with reduced aspect ratio, a smaller number of field raster elements is thus necessary with the same required uniformity.

What is claimed is:

1. An illumination system for a projection exposure system, comprising:
   a light source for the emission of wavelengths of ≦193 nm;
   a device for producing secondary light sources, said device including a mirror having raster elements;
   a diaphragm plane;
   a first optical element for imaging said diaphragm plane in an exit pupil of the illumination system;
   an object plane in which images of said raster elements are substantially in line and illuminate a predetermined field with an intensity distribution; and
   a second optical element for producing a light distribution in said exit pupil, wherein said light distribution is specified by a parameter selected from the group consisting of type and filling degree,
   wherein said parameter is modified by a technique selected from the group consisting of exchanging, displacing and deforming said second optical element,
   wherein said raster elements are of a quantity such that a uniformity of scanning energy values is less than 10%, and
   wherein said scanning energy values are defined as line integrals over said intensity distribution within a predetermined field for points of said field that lie on a straight line perpendicular to a direction of integration.

2. The illumination system of claim 1, wherein said raster elements are of a quantity such that a uniformity of said intensity distribution is less than 10%.

3. The illumination system of claim 1, wherein said raster elements provide a quantity of images that substantially superimpose in said object plane, and wherein said quantity varies by a factor of two to three, by employing said technique.

4. The illumination system of claim 1, wherein said raster elements provide a quantity of images that substantially superimpose in said object plane, and wherein said quantity is greater than 50.

5. The illumination system of claim 1, wherein said field to be illuminated is a ring field.

6. The illumination system of claim 5, wherein said ring field has an aspect ratio that lies between 2:1 and 17.5:1.

7. The illumination system of claim 1, wherein said raster elements have a rectangular form.

8. The illumination system of claim 1, wherein said raster elements have an anamorphotic effect.

9. The illumination system of claim 8, wherein said raster elements produce an anamorphotic effect, and wherein said raster elements are of a form selected from the group consisting of a cylinder and a toroid.

10. The illumination system of claim 8, wherein said raster elements have an aspect ratio that is smaller than an aspect ratio of said field.

11. The illumination system of claim 1, wherein said second optical element has a masking device at a site of said secondary light sources.

12. The illumination system of claim 1, wherein said second optical element has a masking device near said mirror.

13. The illumination system of claim 1, wherein said second optical element is arranged between said light source and said mirror, and wherein an illumination of said mirror is changed by employing said technique.

14. The illumination system of claim 13, wherein said second optical element comprises a controllable scanning mirror.

15. The illumination system of claim 13, wherein said second optical element comprises an optical system with a zoom effect.

16. The illumination system of claim 13, wherein said second optical element comprises a mirror with a deformable surface.

17. The illumination system of claim 16, wherein said mirror with said deformable surface comprises a plurality of manipulators.

18. The illumination system of claim 17, wherein said plurality of manipulators is arranged on an underside of said mirror with said deformable surface.

19. The illumination system of claim 18, wherein said plurality of manipulators comprises a controllable element for deforming said deformable surface, wherein said element is selected from the group consisting of a piezoelectric device and an electromagnetic excitation device.

20. The illumination system of claim 13, wherein said mirror is a first mirror, and wherein said second optical element comprises a second mirror with raster elements.

21. The illumination system of claim 20, further comprising an optical system with a condenser mirror between said second mirror and said first mirror, wherein said raster elements of said second mirror produce images that are substantially superimposed in a plane of said first mirror.

22. The illumination system of claim 20, wherein said second mirror is exchangeable.

23. The illumination system of claim 20, wherein said raster elements of said second mirror have an effect selected form the group consisting of convergent and divergent.

24. The illumination system of claim 20, wherein said raster elements of said second mirror are diffractive.

25. The illumination system of claim 20, wherein said raster elements of said second mirror have an external hexagonal shape.

26. The illumination system of claim 20, wherein said raster elements of said second mirror have off-axis segments of a surface selected from the group consisting of convergent and divergent.

27. The illumination system of claim 13, wherein said second optical element comprises an exchangeable mirror.

28. The illumination system of claim 1, wherein said raster elements are of a shape such that a uniformity of said intensity distribution is less than 10%.

29. The illumination system of claim 1, wherein said illumination system provides a substantially circular distribution of light in said exit pupil.

30. The illumination system of claim 29, wherein said exit pupil has a filling degree σ of less than 1.0.

31. The illumination system of claim 1, wherein the illumination system provides a ring distribution of light in said exit pupil.

32. The illumination system of claim 1, wherein said illumination system provides a quadrupolar distribution of light in said exit pupil.

33. An illumination system for a projection exposure system, comprising:
   a light source for the emission of wavelengths of ≦193 nm;
   a device for producing secondary light sources, said device including a mirror having raster elements;
   a diaphragm plane;
   a first optical element for imaging said diaphragm plane in an exit pupil of the illumination system;
   an object plane in which images of said raster elements are substantially in line and illuminate a predetermined field with an intensity distribution; and
   a second optical element for producing a light distribution in said exit pupil,
   wherein said light distribution is specified by a parameter selected from the group consisting of type and filling degree,
   wherein said parameter is modified by a technique selected from the group consisting of exchanging, displacing and deforming said second optical element,
   wherein said raster elements are of a shape such that a uniformity of scanning energy values is less than 10%, and
   wherein said scanning energy values are defined as line integrals over said intensity distribution within a predetermined field for points that lie on a straight line perpendicular to a direction of integration.

34. An EUV projection exposure system for microlithography, comprising:
   an illumination system having:
      a light source for the emission of wavelengths of ≦193 nm:
      a device for producing secondary light sources, said device including a mirror having raster elements;
      a diaphragm plane;
      a first optical element for imaging said diaphragm plane in an exit pupil of the illumination system;
      an object plane in which images of said raster elements are substantially in line and illuminate a predetermined field with an intensity distribution; and
      a second optical element for producing a light distribution in said exit pupil, wherein said light distribution is specified by a parameter selected from the group consisting of type and filling degree,
      wherein said parameter is modified by a technique selected from the group consisting of exchanging, displacing and deforming said second optical element,
      wherein said raster elements are of a Quantity such that a uniformity of scanning energy values is less than 10%, and
      wherein said scanning energy values are defined as line integrals over said intensity distribution within a predetermined field for points of said field that lie on a straight line perpendicular to a direction of integration;
   a mask;
   a projection objective; and
   a light-sensitive object on a carrier system.

35. A scanning system comprising an EUV projection exposure system having:
   an illumination system having:
      a light source for the emission of wavelengths of ≦193 nm:
      a device for producing secondary light sources, said device including a mirror having raster elements;
      a diaphragm plane;
      a first optical element for imaging said diaphragm plane in an exit pupil of the illumination system;
      an object plane in which images of said raster elements are substantially in line and illuminate a predetermined field with an intensity distribution; and
      a second optical element for producing a light distribution in said exit pupil, wherein said light distribution is specified by a parameter selected from the group consisting of type and filling degree,
      wherein said parameter is modified by a technique selected from the group consisting of exchanging, displacing and deforming said second optical element, wherein said raster elements are of a Quantity such that a uniformity of scanning energy values is less than 10%, and wherein said scanning energy values are defined as line integrals over said intensity distribution within a predetermined field for points of said field that lie on a straight line perpendicular to a direction of integration;

a mask;

a projection objective; and a light-sensitive object on a carrier system.

36. A method for producing microelectronic components, comprising using EUV projection exposure system having:

an illumination system having:

a light source for the emission of wavelengths of $\leq 193$ nm:

a device for producing secondary light sources, said device including a mirror having raster elements;

a diaphragm plane;

a first optical element for imaging said diaphragm plane in an exit pupil of the illumination system;

an object plane in which images of said raster elements are substantially in line and illuminate a predetermined field with an intensity distribution; and a second optical element for producing a light distribution in said exit pupil, wherein said light distribution is specified by a parameter selected from the group consisting of type and filling degree, wherein said parameter is modified by a technique selected from the group consisting of exchanging, displacing and deforming said second optical element, wherein said raster elements are of a Quantity such that a uniformity of scanning energy values is less than 10%, and wherein said scanning energy values are defined as line integrals over said intensity distribution within a predetermined field for points of said field that lie on a straight line perpendicular to a direction of integration;

a mask;

a projection objective; and a light-sensitive object on a carrier system.

37. An illumination system for a projection exposure system, comprising:

a light source for emission of wavelengths of $\leq 193$ nm;

a first plane;

a second plane conjugated to said first plane between said light source and said first plane; and a device for producing a specific light distribution in an exit pupil of said illumination system, wherein said device is situated at or near said second plane.

38. The illumination system of claim 37, further comprising a component for producing secondary light sources, wherein said component includes raster elements.

39. The illumination system of claim 38, further comprising an optical element that images said secondary light sources in said exit pupil.

40. The illumination system of claim 38, wherein said light sources emerge as a light bundle traveling along a light path from said light source to said first plane, and wherein said component for producing secondary light sources is situated in the light path between said light source and said device for producing a specific light distribution.

41. The illumination system of claim 40, wherein said light sources emerge as a light bundle traveling along a light path from said light source to said first plane, and wherein said optical element that images said secondary light sources in said exit pupil is situated in said light path between said component for producing secondary light sources and said device for producing a specific light distribution.

42. The illumination system of claim 37, wherein said device comprises a mirror with a deformable surface.

43. The illumination system of claim 42, wherein said mirror comprises a plurality of manipulators.

44. The illumination system of claim 43, wherein said plurality of manipulators is arranged on an underside of said mirror.

45. The illumination system of claim 43, wherein said plurality of manipulators comprise a controllable element for deforming said deformable surface, and wherein said element is selected from the group consisting of piezoelectric device and an electromagnetic excitation device.

46. The illumination system of claim 42, wherein said deformable surface is controlled such that dynamic deformations with high spatial frequency are excited.

47. The illumination system of claim 46, wherein said dynamic deformations are selected such that discrete images of secondary light sources are displaced in said exit pupil such that said discrete images extensively fill said exit pupil over a time average.

48. The illumination system of claim 37, wherein said device comprises a mirror with raster elements.

49. The illumination system of claim 48, wherein said raster elements are of a form selected from the group consisting of convergent and divergent.

50. The illumination system of claim 48, wherein said raster elements are diffractive.

51. The illumination system of claim 48, wherein said mirror is exchangeable.

52. The illumination system of claim 37, wherein said illumination system provides a substantially circular distribution of light in said exit pupil.

53. The illumination system of claim 52, wherein said exit pupil has a filling degree σ of less than 1.0.

54. The illumination system of claim 37, wherein said illumination system provides a ring distribution of light in said exit pupil.

55. The illumination system of claim 37, wherein said illumination system provides a quadrupolar distribution of said light in said exit pupil.

56. An EUV projection exposure system for microlithography, comprising:

an illumination system having:

a light source for emission of wavelengths of $\leq 193$ nm;

a first plane;

a second plane conjugated to said first plane between said light source and said first plane; and a device for producing a specific light distribution in an exit pupil of said illumination system, wherein said device is situated at or near said second plane;

a mask;

a projection objective; and a light-sensitive object on a carrier system.

57. A scanning system comprising an EUV projection exposure system having:
- an illumination system having:
  - a light source for emission of wavelengths of ≦193 nm;
  - a first plane:
  - a second plane conjugated to said first plane between said light source and said first plane; and
  - a device for producing a specific light distribution in an exit pupil of said illumination system, wherein said device is situated at or near said second plane;
- a mask;
- a projection objective; and
- a light-sensitive object on a carrier system.

58. A method for producing microelectronic components, comprising using an EUV projection exposure system having:
- an illumination system having:
  - a light source for emission of wavelengths of ≦193 nm;
  - a first plane;
  - a second plane conjugated to said first plane between said light source and said first plane; and
  - a device for producing a specific light distribution in an exit pupil of said illumination system, wherein said device is situated at or near said second plane;
- a mask
- a projection objective; and
- a light-sensitive object on a carrier system.

59. An illumination system for forming an illumination field in an object plane, comprising:
- a light source for the emission of a light bundle having wavelengths of ≦193 nm;
- an optical device having a plurality of field raster elements; and
- an optical element, wherein said optical element includes a masking device situated near said optical device.

60. The illumination system according to claim 59, further comprising a light distribution in an exit pupil,
- wherein said light distribution is specified by a parameter selected from the group consisting of type and filling degree, and
- wherein said parameter is modified by a technique selected from the group consisting of exchanging, displacing and deforming said masking device.

61. The illumination system according to claim 59,
- wherein said light bundle illuminates a plurality of field raster elements of said optical device,
- wherein said masking device is shaped such that all incompletely illuminated field raster elements are shaded.

62. An illumination system for forming an illumination field in an object plane, comprising:
- a light source for the emission of a light bundle having a wavelength of ≦193 nm, wherein said light bundle travels along a light path from said light source to said object plane;
- an optical device having a plurality of field raster elements;
- a first optical element; and
- a second optical element,
- wherein said first optical element and second optical element provide an illumination on said optical device,
- wherein said first optical element varies said illumination on said optical device, and
- wherein said second optical element is situated in said light path from said light source to said object plane between said first optical element and said optical device having a plurality of field raster elements.

63. The illumination system of claim 62, wherein said illumination is varied by a technique selected from the group consisting of exchanging, displacing and deforming said first optical element.

64. The illumination system according to claim 63, wherein said illumination on said first optical element is specified by a parameter selected from the group consisting of type and filling degree.

65. The illumination system of claim 62, wherein said first optical element is a scanning mirror.

66. The illumination system of claim 62, wherein said first optical element comprises a plurality of raster elements.

67. The illumination system of claim 62, wherein said second optical element is a collector mirror.

68. An illumination system for forming an illumination field in an object plane and producing a light distribution in an exit pupil, comprising:
- a light source for the emission of a light bundle having a wavelength of ≦193 nm; and
- a mirror with a deformable surface, wherein said mirror reflects said light bundle and said light distribution is adjusted by said mirror.

69. An illumination system for forming an illumination field in an object plane, comprising:
- a light source for the emission of a light bundle having a wavelength of ≦193 nm;
- a mirror with a deformable surface; and
- an optical device having a plurality of field raster elements,
- wherein said mirror provides for an illumination of said optical device, and
- wherein said illumination is varied by deformation of said deformable surface.

70. The illumination system of claim 69, wherein said light bundle travels along a light path from said light source to said object plane and said deformable mirror is situated in said light path before said optical device.

71. The illumination system of claim 69, wherein said mirror with said deformable surface comprises a plurality of manipulators.

72. The illumination system of claim 71, wherein said plurality of manipulators is arranged on an underside of said mirror with said deformable surface.

73. The illumination system of claim 72, wherein said plurality of manipulators comprises a controllable element for deforming said deformable surface, and wherein said element is selected from the group consisting of a piezoelectric device and an electromagnetic excitation device.

74. An illumination system for forming an illumination field in an object plane, comprising:
- a light source for the emission of a light bundle having a wavelength of ≦193 nm traveling along a light path from said light source to said object plane;
- an optical device having a plurality of field raster elements; and
- an optical element, wherein said optical element is situated in the light path before said optical device and said optical element is exchangeable to variable illuminate said optical device.

75. The illumination system of claim 74, wherein said optical element has raster elements.

76. The illumination system of claim 75, wherein said raster elements of said optical element have an effect selected from the group consisting of convergent and divergent.

77. The illumination system of claim 75, wherein said raster elements of said optical element are diffractive.

78. The illumination system of claim 75, wherein said raster elements of said optical element have an external hexagonal shape.

79. The illumination system of claim 75, wherein said raster elements of said optical element have off-axis segments of a surface selected from the group consisting of convergent and divergent.

80. The illumination system of claim 79, further comprising a light distribution in an exit pupil of said illumination system is provided.

81. The illumination system of claim 80, wherein said light distribution is substantially circular in said exit pupil.

82. The illumination system of claim 80, wherein said exit pupil has a filling degree σ of less than 1.0.

83. The illumination system of claim 80, wherein said light distribution is a ring distribution of light in said exit pupil.

84. The illumination system of claim 80, wherein said light distribution is a quadrupolar distribution of said light in said exit pupil.

85. The illumination system of claim 74, further comprising an optical system with a condenser mirror in said light path between said optical element and said optical device.

86. An illumination system for forming an illumination field in a object plane, comprising:

a light source for the emission of a light bundle having a wavelength of $\leq 193$ nm;

an optical device having a plurality of field raster elements; and an optical element, wherein said optical element variable illuminates said optical device, and wherein said field raster elements have an anamorphotic effect.

* * * * *